(12) United States Patent
Ward et al.

(10) Patent No.: US 8,471,238 B2
(45) Date of Patent: Jun. 25, 2013

(54) LIGHT EMITTERS USING NANOTUBES AND METHODS OF MAKING SAME

(75) Inventors: Jonathan W. Ward, Fairfax, VA (US); Mitchell Meinhold, Arlington, MA (US); Claude L. Bertin, South Burlington, VT (US); Benjamin Schlatka, Boston, MA (US); Brent M. Segal, Woburn, MA (US); Thomas Ruckes, Portland, OR (US)

(73) Assignee: Nantero Inc., Woburn, MA (US)

( * ) Notice: Subject to any disclaimer, the term of this patent is extended or adjusted under 35 U.S.C. 154(b) by 875 days.

(21) Appl. No.: 11/227,468

(22) Filed: Sep. 15, 2005

(65) Prior Publication Data
US 2008/0036356 A1 Feb. 14, 2008

Related U.S. Application Data

(60) Provisional application No. 60/610,330, filed on Sep. 16, 2004.

(51) Int. Cl.
*H01L 29/06* (2006.01)

(52) U.S. Cl.
USPC .................................... 257/13; 257/E21.395

(58) Field of Classification Search
USPC ............................................ 257/13, E21.395
See application file for complete search history.

(56) References Cited

U.S. PATENT DOCUMENTS

| | | | |
|---|---|---|---|
| 4,979,149 A | 12/1990 | Popovic et al. | |
| 5,414,654 A | 5/1995 | Kubota et al. | |
| 5,682,345 A | 10/1997 | Roohparvar et al. | |
| 5,818,748 A | 10/1998 | Bertin et al. | |
| 6,013,170 A | 1/2000 | Meade | |
| 6,057,637 A | 5/2000 | Zettl et al. | |
| 6,097,241 A | 8/2000 | Bertin et al. | |
| 6,097,243 A | 8/2000 | Bertin et al. | |
| 6,100,109 A | 8/2000 | Melzner et al. | |
| 6,128,214 A | 10/2000 | Kuekes et al. | |

(Continued)

FOREIGN PATENT DOCUMENTS

| | | |
|---|---|---|
| GB | 2 364 933 A | 2/2002 |
| JP | 2000203821 | 7/2000 |

(Continued)

OTHER PUBLICATIONS

Zettl et al. "Electromechanical Properties of Multiwall Carbon Nanotubes," Nanonetwork Materials edited by Saito et al., 2001.*

(Continued)

*Primary Examiner* — Matthew Reames
(74) *Attorney, Agent, or Firm* — Nantero Inc.

(57) ABSTRACT

Light emitters using nanotubes and methods of making same. A light emitter includes a nanotube article in electrical communication with a first and a second contact, a substrate having a predefined region with a relatively low thermal conductivity said region in predefined physical relation to said nanotube article; and a stimulus circuit in electrical communication with the first and second contacts. The stimulus circuit provides electrical stimulation sufficient to induce light emission from the nanotube article in the proximity of the predefined region. The predefined region is a channel formed in the substrate or a region of material with relatively low thermal conductivity. The light emitter can be integrated with semiconductor circuits including CMOS circuits. The light emitter can be integrated into optical driver circuits (on- and off-chip drivers) and opto-isolators.

12 Claims, 14 Drawing Sheets

U.S. PATENT DOCUMENTS

| | | |
|---|---|---|
| 6,136,160 A | 10/2000 | Hrkut et al. |
| 6,187,823 B1 | 2/2001 | Haddon et al. |
| 6,221,330 B1 | 4/2001 | Moy et al. |
| 6,250,984 B1 | 6/2001 | Jin et al. |
| 6,265,333 B1 | 7/2001 | Dzenis et al. |
| 6,277,318 B1 | 8/2001 | Bower et al. |
| 6,290,839 B1 | 9/2001 | Kayyem |
| 6,322,713 B1 | 11/2001 | Choi et al. |
| 6,331,262 B1 | 12/2001 | Haddon et al. |
| 6,340,822 B1 | 1/2002 | Brown et al. |
| 6,342,276 B1 | 1/2002 | You et al. |
| 6,345,362 B1 | 2/2002 | Bertin et al. |
| 6,346,846 B1 | 2/2002 | Bertin et al. |
| 6,348,295 B1 | 2/2002 | Griffith et al. |
| 6,350,488 B1 | 2/2002 | Lee et al. |
| 6,353,552 B2 | 3/2002 | Sample et al. |
| 6,361,861 B2 | 3/2002 | Gao et al. |
| 6,361,958 B1 | 3/2002 | Shieh et al. |
| 6,368,569 B1 | 4/2002 | Haddon et al. |
| 6,373,771 B1 | 4/2002 | Fifield et al. |
| 6,376,787 B1 | 4/2002 | Martin et al. |
| 6,400,088 B1 | 6/2002 | Livingston et al. |
| 6,409,567 B1 | 6/2002 | Amey et al. |
| 6,423,583 B1 | 7/2002 | Avouris et al. |
| 6,426,687 B1 | 7/2002 | Osborn |
| 6,436,189 B1 | 8/2002 | Reuscher |
| 6,437,329 B1 | 8/2002 | Yedur et al. |
| 6,443,901 B1 | 9/2002 | Fraser |
| 6,445,006 B1 | 9/2002 | Brandes et al. |
| 6,495,116 B1 | 12/2002 | Herman |
| 6,495,258 B1 | 12/2002 | Chen et al. |
| 6,514,113 B1 | 2/2003 | Lee et al. |
| 6,515,339 B2 | 2/2003 | Shin et al. |
| 6,528,020 B1 | 3/2003 | Dai et al. |
| 6,531,513 B2 | 3/2003 | Haddon et al. |
| 6,541,309 B2 | 4/2003 | Chen |
| 6,548,841 B2 | 4/2003 | Frazier et al. |
| 6,574,130 B2 | 6/2003 | Segal et al. |
| 6,586,965 B2 | 7/2003 | Kuekes |
| 6,611,033 B2 | 8/2003 | Hsu et al. |
| 6,625,047 B2 | 9/2003 | Coleman, Jr. |
| 6,625,740 B1 | 9/2003 | Datar et al. |
| 6,630,772 B1 | 10/2003 | Bower et al. |
| 6,641,793 B2 | 11/2003 | Haddon et al. |
| 6,643,165 B2 | 11/2003 | Segal et al. |
| 6,645,628 B2 | 11/2003 | Shiffler, Jr. et al. |
| 6,658,634 B1 | 12/2003 | Goodnow et al. |
| 6,661,270 B2 | 12/2003 | Nagata |
| 6,706,402 B2 | 3/2004 | Rueckes et al. |
| 6,706,566 B2 | 3/2004 | Avouris et al. |
| 6,707,098 B2 | 3/2004 | Hofmann et al. |
| 6,709,566 B2 | 3/2004 | Cumings et al. |
| 6,743,408 B2 | 6/2004 | Lieber et al. |
| 6,781,166 B2 | 8/2004 | Lieber et al. |
| 6,784,028 B2 | 8/2004 | Rueckes et al. |
| 6,794,914 B2 | 9/2004 | Sani et al. |
| 6,803,260 B2 | 10/2004 | Shin et al. |
| 6,803,840 B2 | 10/2004 | Hunt et al. |
| 6,808,746 B1 | 10/2004 | Dai et al. |
| 6,809,462 B2 | 10/2004 | Pelrine et al. |
| 6,809,465 B2 | 10/2004 | Jin |
| 6,833,558 B2 | 12/2004 | Lee et al. |
| 6,835,591 B2 | 12/2004 | Rueckes et al. |
| 6,835,613 B2 | 12/2004 | Schlaf |
| 6,858,197 B1 | 2/2005 | Delzeit |
| 6,863,942 B2 | 3/2005 | Ren et al. |
| 6,888,773 B2 | 5/2005 | Morimoto |
| 6,890,780 B2 | 5/2005 | Lee |
| 6,896,864 B2 | 5/2005 | Clarke |
| 6,899,945 B2 | 5/2005 | Smalley et al. |
| 6,905,892 B2 | 6/2005 | Esmark |
| 6,911,682 B2 | 6/2005 | Rueckes et al. |
| 6,918,284 B2 | 7/2005 | Snow et al. |
| 6,919,592 B2 | 7/2005 | Segal et al. |
| 6,919,730 B2 | 7/2005 | Cole et al. |
| 6,919,740 B2 | 7/2005 | Snider |
| 6,921,575 B2 | 7/2005 | Horiuchi et al. |
| 6,924,538 B2 | 8/2005 | Jaiprakash et al. |
| 6,946,410 B2 | 9/2005 | French et al. |
| 6,946,851 B2 | 9/2005 | Lee et al. |
| 6,955,937 B1 | 10/2005 | Burke et al. |
| 6,968,486 B2 | 11/2005 | Matsushima |
| 6,969,651 B1 | 11/2005 | Lu et al. |
| 6,986,962 B2 | 1/2006 | Oyanagi et al. |
| 7,015,500 B2 | 3/2006 | Choi et al. |
| 7,048,999 B2 | 5/2006 | Smalley et al. |
| 7,054,194 B2 | 5/2006 | Liaw et al. |
| 7,057,402 B2 | 6/2006 | Cole et al. |
| 2001/0004979 A1 | 6/2001 | Han et al. |
| 2002/0130311 A1 | 9/2002 | Lieber et al. |
| 2002/0130353 A1 | 9/2002 | Lieber et al. |
| 2002/0136896 A1 | 9/2002 | Takikawa et al. |
| 2002/0160111 A1 | 10/2002 | Sun et al. |
| 2002/0172963 A1 | 11/2002 | Kelley et al. |
| 2002/0173083 A1 | 11/2002 | Avouris et al. |
| 2002/0179434 A1 | 12/2002 | Dai et al. |
| 2003/0004058 A1 | 1/2003 | Li et al. |
| 2003/0021141 A1 | 1/2003 | Segal et al. |
| 2003/0021966 A1 | 1/2003 | Segal et al. |
| 2003/0022428 A1 | 1/2003 | Segal et al. |
| 2003/0042834 A1 | 3/2003 | Dean et al. |
| 2003/0091825 A1 | 5/2003 | Shiffler et al. |
| 2003/0118727 A1 | 6/2003 | Ting et al. |
| 2003/0119034 A1 | 6/2003 | Kang et al. |
| 2003/0122111 A1 | 7/2003 | Glatkowski |
| 2003/0124325 A1 | 7/2003 | Rueckes et al. |
| 2003/0124837 A1 | 7/2003 | Rueckes et al. |
| 2003/0132823 A1 | 7/2003 | Hyman et al. |
| 2003/0134267 A1 | 7/2003 | Kang et al. |
| 2003/0165074 A1 | 9/2003 | Segal et al. |
| 2003/0177450 A1 | 9/2003 | Nugent |
| 2003/0180472 A1 | 9/2003 | Zhou et al. |
| 2003/0198812 A1 | 10/2003 | Rueckes et al. |
| 2003/0199172 A1 | 10/2003 | Rueckes et al. |
| 2003/0200521 A1 | 10/2003 | DeHon et al. |
| 2003/0205966 A1 | 11/2003 | Chen et al. |
| 2003/0206436 A1 | 11/2003 | Eaton et al. |
| 2003/0234407 A1 | 12/2003 | Vogeli et al. |
| 2003/0236000 A1 | 12/2003 | Vogeli et al. |
| 2004/0005723 A1 | 1/2004 | Empedocles et al. |
| 2004/0007528 A1 | 1/2004 | Bakajin et al. |
| 2004/0023253 A1 | 2/2004 | Kunwar et al. |
| 2004/0023514 A1 | 2/2004 | Moriya et al. |
| 2004/0031975 A1 | 2/2004 | Kern et al. |
| 2004/0035355 A1 | 2/2004 | Avouris et al. |
| 2004/0041154 A1 | 3/2004 | Watanabe et al. |
| 2004/0043527 A1 | 3/2004 | Bradley et al. |
| 2004/0071949 A1 | 4/2004 | Glatkowski et al. |
| 2004/0072335 A1 | 4/2004 | Boege et al. |
| 2004/0075159 A1 | 4/2004 | Vogeli |
| 2004/0077107 A1 | 4/2004 | Vogeli |
| 2004/0085805 A1 | 5/2004 | Segal et al. |
| 2004/0087162 A1 | 5/2004 | Vogeli |
| 2004/0099438 A1 | 5/2004 | Arthur et al. |
| 2004/0104129 A1 | 6/2004 | Gu et al. |
| 2004/0132070 A1 | 7/2004 | Star et al. |
| 2004/0159833 A1 | 8/2004 | Rueckes et al. |
| 2004/0164289 A1 | 8/2004 | Rueckes et al. |
| 2004/0175856 A1 | 9/2004 | Jaiprakash et al. |
| 2004/0181630 A1 | 9/2004 | Jaiprakash et al. |
| 2004/0191978 A1 | 9/2004 | Rueckes et al. |
| 2004/0214366 A1 | 10/2004 | Segal et al. |
| 2004/0214367 A1 | 10/2004 | Segal et al. |
| 2004/0238907 A1 | 12/2004 | Pinkerton et al. |
| 2004/0253167 A1 | 12/2004 | Silva et al. |
| 2004/0265550 A1 | 12/2004 | Glatkowski et al. |
| 2004/0266106 A1 | 12/2004 | Lee |
| 2005/0007002 A1 | 1/2005 | Golovchenko et al. |
| 2005/0035344 A1 | 2/2005 | Bertin et al. |
| 2005/0035367 A1 | 2/2005 | Bertin et al. |
| 2005/0035786 A1 | 2/2005 | Bertin et al. |
| 2005/0035787 A1 | 2/2005 | Bertin et al. |
| 2005/0036365 A1 | 2/2005 | Bertin et al. |
| 2005/0037547 A1 | 2/2005 | Bertin et al. |
| 2005/0040874 A1 | 2/2005 | Allison et al. |
| 2005/0041465 A1 | 2/2005 | Rueckes et al. |
| 2005/0041466 A1 | 2/2005 | Rueckes et al. |

| | | | |
|---|---|---|---|
| 2005/0047244 | A1 | 3/2005 | Rueckes et al. |
| 2005/0052894 | A1 | 3/2005 | Segal et al. |
| 2005/0053525 | A1 | 3/2005 | Segal et al. |
| 2005/0056825 | A1 | 3/2005 | Bertin et al. |
| 2005/0056866 | A1 | 3/2005 | Bertin et al. |
| 2005/0056877 | A1 | 3/2005 | Rueckes et al. |
| 2005/0058590 | A1 | 3/2005 | Sen et al. |
| 2005/0058797 | A1 | 3/2005 | Sen et al. |
| 2005/0058834 | A1 | 3/2005 | Rueckes et al. |
| 2005/0059176 | A1 | 3/2005 | Rueckes et al. |
| 2005/0059210 | A1 | 3/2005 | Rueckes et al. |
| 2005/0062035 | A1 | 3/2005 | Bertin et al. |
| 2005/0062062 | A1 | 3/2005 | Bertin et al. |
| 2005/0062070 | A1 | 3/2005 | Bertin et al. |
| 2005/0063210 | A1 | 3/2005 | Segal et al. |
| 2005/0063244 | A1 | 3/2005 | Bertin et al. |
| 2005/0065741 | A1 | 3/2005 | Segal et al. |
| 2005/0068128 | A1 | 3/2005 | Yip |
| 2005/0074926 | A1 | 4/2005 | Bertin et al. |
| 2005/0077527 | A1* | 4/2005 | Lee ................................ 257/79 |
| 2005/0095938 | A1 | 5/2005 | Rosenberger et al. |
| 2005/0101112 | A1 | 5/2005 | Rueckes et al. |
| 2005/0128788 | A1 | 6/2005 | Segal et al. |
| 2005/0139902 | A1 | 6/2005 | Jung |
| 2005/0141266 | A1 | 6/2005 | Jung |
| 2005/0141272 | A1 | 6/2005 | Jung |
| 2005/0162896 | A1 | 7/2005 | Jung |
| 2005/0174842 | A1 | 8/2005 | Bertin et al. |
| 2005/0191495 | A1 | 9/2005 | Rueckes et al. |
| 2005/0212014 | A1 | 9/2005 | Horibe et al. |
| 2005/0237781 | A1 | 10/2005 | Bertin et al. |
| 2005/0269553 | A1 | 12/2005 | Sen et al. |
| 2005/0269554 | A1 | 12/2005 | Sen et al. |
| 2005/0270824 | A1 | 12/2005 | Bertin et al. |
| 2005/0279988 | A1 | 12/2005 | Bertin |
| 2005/0280436 | A1 | 12/2005 | Bertin |
| 2005/0281084 | A1 | 12/2005 | Rueckes et al. |
| 2005/0282515 | A1 | 12/2005 | Bertin |
| 2005/0282516 | A1 | 12/2005 | Bertin |
| 2006/0044035 | A1 | 3/2006 | Bertin |
| 2006/0052509 | A1 | 3/2006 | Saitoh |
| 2006/0061389 | A1 | 3/2006 | Bertin |
| 2006/0125033 | A1 | 6/2006 | Segal et al. |
| 2006/0128049 | A1 | 6/2006 | Jaiprakash et al. |
| 2006/0183278 | A1 | 8/2006 | Bertin et al. |
| 2006/0193093 | A1 | 8/2006 | Bertin et al. |
| 2006/0204427 | A1 | 9/2006 | Ghenciu et al. |
| 2006/0231865 | A1 | 10/2006 | Rueckes et al. |
| 2006/0237537 | A1 | 10/2006 | Empedocles et al. |
| 2006/0237805 | A1 | 10/2006 | Segal et al. |
| 2006/0250843 | A1 | 11/2006 | Bertin et al. |
| 2006/0250856 | A1 | 11/2006 | Bertin et al. |
| 2006/0255834 | A1 | 11/2006 | Bertin |
| 2006/0276056 | A1 | 12/2006 | Ward et al. |
| 2007/0004191 | A1 | 1/2007 | Gu et al. |
| 2007/0015303 | A1 | 1/2007 | Bertin et al. |

FOREIGN PATENT DOCUMENTS

| | | |
|---|---|---|
| JP | 2001-035362 A2 | 2/2001 |
| JP | 2004-090208 A2 | 3/2004 |
| WO | WO-98/39250 A1 | 9/1998 |
| WO | WO-99/65821 A1 | 12/1999 |
| WO | WO-01/03208 | 1/2001 |
| WO | WO-02/45113 A1 | 6/2002 |
| WO | WO-02/48701 A2 | 6/2002 |
| WO | WO-03/016901 A1 | 2/2003 |
| WO | WO-03/034142 A1 | 4/2003 |
| WO | WO-03/091486 | 11/2003 |
| WO | WO-2004/065655 | 8/2004 |
| WO | WO-2004/065657 | 8/2004 |
| WO | WO-2004/065671 | 8/2004 |

OTHER PUBLICATIONS

Li et al. "Polarized incandescent light emission from carbon nanotubes," Applied Physics Letters 82 1763, 2003.*
Ajayan, P. M. et al., "Applications of Carbon Nanotubes", Topics Appl. Phys., vol. 80, pp. 391-425, 2001.
Berhan, L. et al., "Mechanical properties of nanotube sheets: Alterations in joing morphology and achievable moduli in manufacturable materials", Journal of Applied Physics, vol. 95, No. 8, pp. 4335-4345, Apr. 15, 2004.
Bonard, J. M. et al., "Monodisperse Multiwall Carbon Nanotubes Obtained with Ferritin as Catalyst", Nano Letters, vol. 2, No. 6, pp. 665-667, 2002.
Cassell, A. M. et al., "Large Scale CVD Synthesis of Single-Walled Carbon Nanotubes", J. Phys. Chem. B, vol. 103, pp. 6484-6492, 1999.
Chen, B. et al., "Heterogeneous Single-Walled Carbon Nanotube Catalyst Discovery and Optimization", Chem. Mater., vol. 14, pp. 1891-1896, 2002.
Cheng, H. M. et al., "Large-scale and low-cost synthesis of single-walled carbon nanotubes by the catalytic pyrolysis of hydrocarbons", Applied Physics Letters, vol. 72, No. 25, pp. 3282-3284, Jun. 22, 1998.
Dai, H. et al., "Controlled Chemical Routes to Nanotube Architectures, Physics, and Devices", J. Phys. Chem. B., vol. 103, pp. 11246-11255, 1999.
Franklin, N. R. et al., "An Enhanced CVD Approach to Extensive Nanotube Networks with Directionality", Advanced Materials, Communications, 5 pages, Mar. 28, 2000.
Hafner, J. H. et al., "Catalytic growth of single-wall carbon nanotubes form metal particles", Chemical Physics Letters, vol. 296, pp. 195-202, 1998.
Homma, Y. et al., "Single-Walled Carbon Nanotube Growth on Silicon Substrates using Nanoparticle Catalysts", Jpn. J. Appl. Phys., vol. 4, No. 1A/B, pt. 2, 3 pages, 2002.
Joselevich, E., "Vectorial Growth of Metallic and Semiconducting Single-Wall Carbon Nanotubes", Nano Letters, vol. 0, No. 0, pp. A-E, Aug. 13, 2002.
Kong, J. et al., "Chemical vapor deposition of methane for single-walled carbon nanotubes", Chemical Physics Letters, vol. 292, pp. 56-574, 1998.
Kong, J. et al., "Nanotube Molecular Wires as Chemical Sensors", Science, vol. 287, pp. 622-625, Jan. 28, 2000.
Li, J. et al., "Carbon Nanotube Nanoelectrode Array for Ultrasensitive DNA Detection", Nano Letters, vol. 3, No. 5, pp. 597-602, 2003.
Li, Y. et al., "Growth of Single-Walled Carbon Nanotubes from Discrete Catalytic Nanoparticles of Various Sizes", J. Phys. Chem. B., vol. 105, pp. 11424-11431, 2001.
Li, Y. et al., "Preparation of Monodispersed Fe—Mo Nanoparticles as the Catalyst for CVD Synthesis of Carbon Nanotubes", Chem. Mater., vol. 13, pp. 1008-1014, 2001.
Neurshev, O. et al., "Carbon nanotube filmes obtained by thermal chemical vapor deposition", J. Mater. Chem., vol. 11, pp. 1122-1132, 2001.
Parikh, K. et al., "Flexible vapour sensors using single walled carbon nanotubes", Sensors and Actuators B., vol. 113, pp. 55-63, 2006.
Peigney, A. et al., "A Study of the Formation of Single- and Double-Walled Carbon Nanotubes by a CVD Method", J. Phys. Chem., vol. 105, pp. 9699-9710, 2001.
Qi, P. et al., "Toward Large Arrays of Multiplex Functionalized Carbon Nanotube Sensors for Highly Sensitive and Selective Molecular Detection", Nano Letters, vol. 3, No. 3, pp. 347-351, 2003.
Sotiropoulou, S. et al., "Carbon nanotube array-based biosensor", Anal. Bioana. Chem, vol. 375, pp. 103-105, 2003.
Valentini, L. et al., "Sensors for sub-ppm $NO_2$ gas detection based on carbon nanotube thin films", Applied Physics Letters, vol. 82, No. 6, pp. 961-963, Feb. 10, 2003.
Zhang, Y. et al., "Metal coating on suspended carbon nanotubes and its implication to metal-tube interaction", Chemical Physics Letters, vol. 331, pp. 35-41, 2000.
Zhang, Z. et al., "Select Pathways to Carbon Nanotube Film Growth", Advanced Materials, Communications, 4 pages, Jun. 19, 2001.
Zhao, Y. P. et al., "Frequency-dependent electrical transport in carbon nanotubes", Physical Review B., vol. 64, pp. 201402-1 to 201402-4. 2001.
Ajayan, P.M., et al., "Nanometric-Size Tubes of Carbon", Rep. Prog. Phys. 60 (1997) 1025-1062.
Berber, S. et al., *Phys. Rev. Lett.* 84, 2000, p. 4613-4616.

Bernholc et al., "Mechanical and electrical properties of nanotubes". *Ann. Rev. Mater. Res.*, vol. 32, p. 347, 2002.

Chen, J. et al., "Solution Properties of Single-Walled Carbon Nanotubes," *Science*, Oct. 2, 1998, vol. 282, pp. 95-98.

Chen, R.J. et al., "Noncovalent Sidewall Functionalization of Single-Walled Carbon Nanotubes for Protein Immobilization", *J. Am. Chem. Soc.*, vol. 123, 2002, pp. 3838-3839.

Collins, P.G. et al., "Engineering Carbon Nanotubes and Nanotube Circuits Using Electrical Breakdown," *Science*, Apr. 2001, vol. 292, pp. 706-709.

Dai et al., *Appl. Phys. Lett.*, vol. 77, 2000, pp. 3015-3017.

Desai et al., "Freestanding Carbon Nanotube Specific Fabrication", *Proc. of 2005, 5th IEEE Conf., Nanotech*, Nagoya, Japan, pp. 1-4, Jul. 2005.

Freitag, M. et al., "Photoconductivity of Single Carbon Nanotubes," *Nano Letters*, Jun. 6, 2003, vol. 3, No. 8, pp. 1067-1071.

Georgakilas, V., "Organic Functionalizatin of Carbon Nanotubes," *J. Am. Chem. Soc.*, Jan. 8, 2002, vol. 124, No. 5, pp. 760-761.

Imholt, T. J., "Nanotubes in Microwave Fields: Light Emission, Intense Heat, Outgassing, and Reconstructin," Downloaded from Web, 2004, pp. 1-2.

Islam, M. F. et al. "High Weight Fractin Surfactant Solubilizatin of Single-Wall Carbon Nanotubes in Water," *Nano Letters*, Jan. 16, 2003, vol. 3, No. 2, pp. 269-273.

Kaneto et al., "Electrical conductivities of multi-wall carbon nano tubes", *Synthethic Materials*, Elsevier Science, SA., vol. 203, pp. 2543-2546, 1999.

Kinaret et al., "A carbon-nanotube-based nanorelay", *Applied Physics Letters*, vol. 82, No. 8, pp. 1287-1289, Feb. 24, 2003.

Li, Peng et al. "Polarized Incandescent light emissin from carbon nanotubes," *Applied Physics Letters*, Mar. 17, 2003, vol. 81, No. 11, pp. 1763-1765.

Liu, A. et al. "A High-Speed Silicon Optical Modulator Based on a Metal-Oxide-Semiconductor Capacitor," *Nature*, Feb. 12, 2004, vol. 427, pp. 615-618.

Martel, R. et al., "Carbon Nanotube Field-Effect Transistsors and Logic Circuits", *DAC*, vol. 7.4m, pp. 94-98, Jan. 2002.

Misewich, J. A. et al., "Electrically Induced Optical Emission from a Carbon Nanotube FET," *Science*, May 2, 2003, vol. 300, pp. 783-786.

Moore, V. C., "Individually Suspended Single-Walled Carbon Nanotubes in Various Surfactants," *Nano Letters*, Sep. 9, 2003, vol. 3, No. 10, pp. 1379-1382.

Onoa, G.B. et al., "Bulk production of singly dispersed carbon nanotubes with prescribed lengths," *Nanotechnology*, vol. 16, pp. 2799-2803, 2005.

Pompeo, F. et al., "Water Solubilization of Single-Walled Carbon Nanotubes by Functinalizatin with Flucosamine," *Nano Letters*, Jan. 26, 2002, vol. 2, No. 4, pp. 369-373.

Purcell, S. T. et al., "Hot Nanotubes: Stable Heating of Individual Mutiwall Carbon Nanotubes to 2000 K Induced by the Field-Emission Current," *Physical Review Letters*, Mar. 11, 2002, vol. 88, No. 1, pp. 105502-1-105502-4.

Reed, G. T., "The optical age of silicon," *Nature*, Feb. 12, 2004, vol. 427, pp. 595-596.

Research—Multifunctional Nanotube Composites, http://www.ornl.gov/-odg/compositesmain.html (3 pages).

Riggs, J. E. et al., "Strong Luminescence of Solubilized Carbon Nanotubes," *J. Am. Chem. Soc.* Jun. 2, 2000, vol. 122, pp. 5879-5880.

Rotkin, S.V., "Theory of Nanotube Nanodevices," Published on Web Oct. 11, 2002, pp. 1-22.

Rueckes, T. et al., "Carbon Nanotube-Based Nonvolatile Random Access Memory for Molecular Computing", *Sciencemag.*, vol. 289, pp. 94-97, Jul. 7, 2000.

Shim, M. et al., "Photoinduced conductivity changes in carbon nanotube transistors," *Applied Physics Letters*, Oct. 27, 2003, vol. 83, No. 17, pp. 3564-3566.

Stadermann, M. et al., "Nanoscale study of conduction through carbon nanotube networks," *Phys. Rev. B 69*, 201402(R), 2004.

Sun, Y. P. et al., "Soluble Dendron-functionalizatn Carbon Nanotubes: Preparation, Characterization, and Properties," *Chem. Mater.*, Aug. 24, 2001, vol. 13, pp. 2864-2869.

Sun, Y., "High Dissolution and Strong ELight Emission of Carbon nanotubes in Aromatic Amine Solvents," *J. Am. Chem.Soc.* May 11, 2001, vol. 123, pp. 5348-5349.

Sveningsson, M. et al., "Blackbody radiation from resistively heated multiwalled carbon nanotubes during field emission," *Applied Physics Leters*, Aug. 5, 2002, vol. 81, No. 6, pp. 1095-1097.

Tong, L., et al., "Subwavelength-diameter silica wires for low-loss optical wave guidling," *Nature*, Dec. 18/25, 2003, vol. 426, pp. 816-819.

Vincent, P. et al., "Modelizatin of Resistive Heating of Carbon Nanotubes during Field Emission," *Physical Review B.*, Aug. 6, 2002, vol. 66, pp. 075406-1-075406.5.

Wei, Jinquan et al., "Carbon nanotube filaments in household light bulbs," *Applied Physics Letters*, Jun. 14, 2004, vol. 84, No. 24, pp. 4869-4871.

Zhang, Y., "Formation of Metal Nanowires on Suspended Single-Walled Carbon Nanotubes", *Appl. Phys. Lett.*, 2000, vol. 77, pp. 3015-3017.

Ago et al., "Work Function of Purified and Oxidised Carbon Nanotubes," Synthetic Metals, vol. 103, pp. 2494-2495 (1999).

Banerjee et al., "Functionalization of Carbon Nanotubes with a Metal-Containing Molecular Complex," Nano Letters, vol. 2, No. 1, pp. 49-53 (2002).

Chiang, et al., Purification and Characterization of Single-Wall Carbon Nanotubes (SWNTs) Obtained from the Gas-Phase Decomposition of CO (HiPco Process), J. Phys. Chem. B, vol. 105, pp. 8297-8301, 2001.

Delzeit et al., "Mulilayered Metal Catalysts for Controlling the Density of Single-Walled Carbon Nanotubes Growth," Chemical Physics Letters, vol. 348, pp. 368-374, Nov. 16, 2001.

Haddon et al., "Purification and Separation of Carbon Nanotubes," MRS Bulletin, pp. 252-259, Apr. 2004.

International Search Report for PCT/U2005/045316, Sep. 6, 2006, 2 pages.

International Search Report and Written Opinion for International Patent Application No. PCT/US05/18467, Oct. 1, 2007, 5 pages.

International Search Report, International Patent Application No. PCT/US05/18539, Sep. 18, 2006, 4 pages.

Jeong et al., "A New Purification Method of Single-Wall Carbon Nanotubes Using H2S and O2 Mixutre Gas," chemical Physics Letters, vol. 344, pp. 18-22, Aug. 17, 2001.

Kahn, M.G.C. et al., "Solubilization of Oxidized Single-Walled Carbon Nanotubes in Organic and Aqueous Solvents through Organic Derivatization," Nano Letters 2002, vol. 2, No. 11, 1215-1218.

Niu, C. et al., "High power electrochemical capacitors based on carbon nanotube electrodes," Appl. Phys. Lett. 70(11), Mar. 17, 1997, pp. 1480-1482.

Shelimov, K.B. et al., "Purification of single-wall carbon nanotubes by ultrasonically assisted filtration," Chemical Physics Letters 282 (1998) 429-434.

Brown, K. M., "System in package The Rebirth of SIP", 2004 IEEE Custom Integrated Circuits, May 2004, 6 pgs.

Crowley, et al., "512 Mb PROM with 8 layers of antifuse/Diode cells," IEEE International Solid-State Circuits conference, vol. XLVI, Feb. 2003, pp. 284-285.

Cui, et al., "Carbon Nanotube Memory Devices of High Charge," Appl. Phys. Ltrs., vol. 81, No. 17, Oct. 2002, pp. 3260-3262.

Desai, et al., "Freestanding Carbon Nanotube Specimen Fabrication," Proceeding 2005 5th IEEE Conference on Nanotechnology, Nagoya, Japan, Jul. 2005.

Fuhrer, et al., "High-Mobility Nanotube Transistor Memory," Nano Letters, vol. 2, No. 7, 2002, pp. 755-759.

Hone, et al., "Quantized Phonon Spectrum of Single-Wall Carbon Nanotubes," Science, vol. 289, 2000, pp. 1730-1733.

Ng, "Complete Guide to Semiconducting Devices," 2nd Edition, John Wiley and Sons, 2002, pp. 11-23, 24-42, 396-407.

Novak, et al., "Nerve Agent Using Networks of Single-Walled Carbon Nanotubes," Appl. Phys. Ltr., vol. 83, No. 19, Nov. 2003, pp. 4026-4028.

Popov, "Carbon Nanotubes: properties and applications," Mat. Sci. Eng. R 43, 2004, pp. 61-102.

Snow, et al., "Random Networks of Carbon Nanotubes as an Electronic Material," App. Phys. Ltrs., vol. 82, No. 13, Mar. 2003, pp. 2145-2147.

Star, et al., "Nanoelectronic Carbon Dioxide Sensors," Adv. Mater., vol. 16, No. 22, 2004, pp. 2049-2052.

Star, et al., "Nanotube Optoelectronic Memory Devices," Nano Letters, vol. 4, No. 9, 2004, pp. 1587-1591.

Zhang, et al., "Formation of Metal Nanowires of Suspended Single-Walled Carbon Nanotubes," Appl. Phys. Ltrs., vol. 77, No. 19, Nov. 2000, pp. 3015-3017.

Zhou, et al., "p-Channel, n-Channel Thin Film Transistors and p-n Diodes Based on Single Wall Carbon Nanotube Networks," Nano Letters, vol. 4, No. 10, 2004, pp. 2031-2035.

* cited by examiner

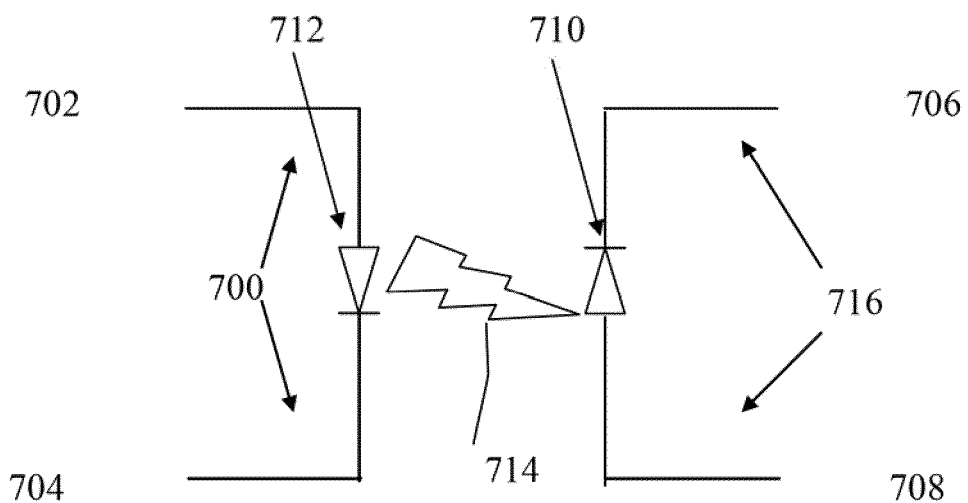
Figure 7A: Prior Art Opto-Isolator
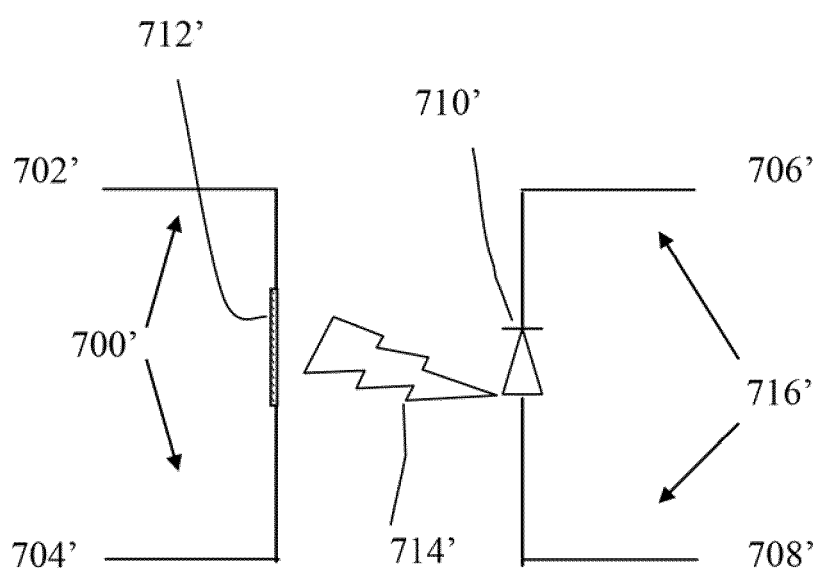
Figure 7B: Carbon Nanotube Opto-Isolator

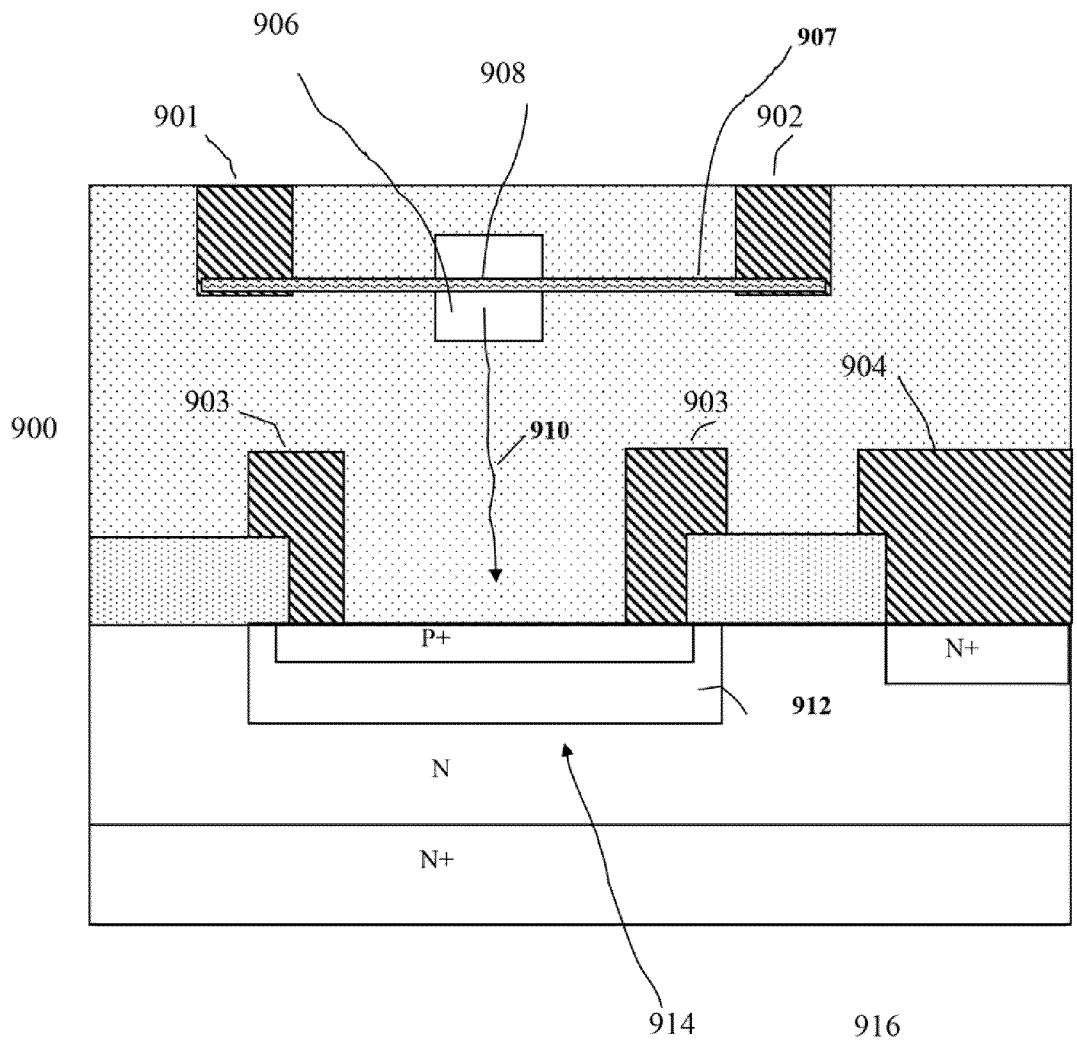
Figure 9: Carbon Nanotube and Photodiode Structure

LIGHT EMITTERS USING NANOTUBES AND METHODS OF MAKING SAME

CROSS-REFERENCE TO RELATED APPLICATIONS

This application claims priority under 35 U.S.C. §119(e) to U.S. Provisional Pat. Apl. No. 60/610,330, filed on Sep. 16, 2004, entitled Light Emitters Using Nanotubes and Methods of Making Same, which is incorporated herein by reference in its entirety.

BACKGROUND

1. Technical Field

The present application relates generally to nanotube fabrics and methods of making same and, more specifically to carbon nanotube fabrics and methods of making same for use in light emitting systems.

2. Discussion of Related Art

Opto-electronics technologies have been utilized and developed in various fields such as the information input/output technologies and the optical communication technologies using optical fibers, and so on. Laser diodes have been developed as devices which support these opto-electronics technologies. For example, laser diodes can be used for reading compact discs and they can be used in optical communications.

Light emitting diodes (LEDs) are special p-n junctions that are designed for optimum electroluminescence as described in Kwok K. NG, "Complete Guide to Semiconductor Devices," IEEE Press, John Wiley & Sons, 2002, pages 396-404. Semiconductor materials, mostly III-V compounds are used, although some II-VI compounds are used as well. Doped active films are usually grown epitaxially on substrates such as GaAs, GaP, and InP. LEDs emit in a well-defined portion of the spectrum at particular wavelengths and with corresponding colors as illustrated in FIG. 51.2 of the above NG reference. These devices are usually discrete, do not integrate with silicon, and usually emit a particular color, with multiple LEDs required to obtain a near-white light (in those applications where near-white light is desirable).

Photodiodes are p-n diodes or p-i-n diodes that absorb light as described in Kwok K. NG, "Complete Guide to Semiconductor Devices," IEEE Press, John Wiley & Sons, 2002, pages 431-435. Photodiodes typically operate under a moderate reverse bias with reverse bias current increasing rapidly with absorbed light (radiation). Photodiodes are often fabricated in silicon substrates and integrate well with various devices and circuits. Photodiode speed of operation has been demonstrated in excess of 30 GHz.

Currently, light emitters used for optoelectronic applications in the semiconductor industry are typically micron-sized and cannot be monolithically integrated but are discrete components. There is therefore a need in the art for large scale fabrication methods of nanoscale light emitters used for electronic applications in the semiconductor industry which can be monolithically integrated into a CMOS or similar process flow to fabricate integrated circuits. Naturally, the uses of such elements extend to most types of consumer electronics where light emission in integrated elements is beneficial.

Misewich et al. have reported IR light emission from single-walled nanotubes (SWNT) (See "Electrically Induced Optical Emission from a Carbon Nanotube FET," Science 200 (2003) 783-786). IBM's research team detected light with a wavelength of 1.5 micrometers, which is particularly valuable because it is the wavelength widely used in optical communications. Nanotubes with different diameters could generate light with different wavelengths used in other applications. The investigators report that the mechanism for light emission in the structures studied is electron-hole recombination.

Wei et al. report the use of carbon nanotubes as incandescent light sources which operate by black body radiation and at higher temperatures, perhaps by some other mechanism such as electron/hole recombination. (See "Carbon Nanotube Filaments in Household Lightbulbs," Appl. Phys. Lett. 84 (2004) 4869-4871.)

SUMMARY

The invention provides light emitters using nanotubes and methods of making same.

Under one aspect of the invention, a light emitter includes a nanotube article in electrical communication with a first and a second contact, a substrate having a predefined region with a relatively low thermal conductivity said region in predefined physical relation to said nanotube article; and a stimulus circuit in electrical communication with the first and second contacts. The stimulus circuit provides electrical stimulation sufficient to induce light emission from the nanotube article in the proximity of the predefined region.

Under another aspect of the invention the predefined region is a channel formed in the substrate or a region of material with relatively low thermal conductivity.

Under another aspect of the invention light emitter can be integrated with semiconductor circuits including CMOS circuits.

Under another aspect of the invention light emitter can be integrated into optical driver circuits (on- and off-chip drivers) and opto-isolators.

BRIEF DESCRIPTION OF THE DRAWINGS

In the Drawings:

FIG. 7A illustrates a prior art opto-isolator;

FIG. 7B illustrates an exemplary carbon nanotube opto-isolator;

FIG. 9 illustrates an integrated nanotube opto-isolator and optical driver;

DETAILED DESCRIPTION

The inventors have observed that fabrics of carbon nanotubes suspended over gaps (90-180 nm, e.g.) could be resistively heated to extremely high temperatures in inert gas environments, >600° C. At modest current through these suspended structures, light emission was observed from these devices, indicative of high enough local temperatures to enable radiative heat loss.

Suspended single-walled and multi-walled carbon nanotubes emit light from the regions which are suspended over a gap while an electrical current is passed through them. When the supports are made of thermally conducting material, the light emission occurs only in the suspended region of the nanotubes, not in the regions of the nanotubes in contact with the supports.

These NT light emitters have several important and unique features that are not available with existing technologies. First, ULSI arrays of these NT light emitters can be formed using patterning technology at minimum dimensions of the lithography node used, i.e. Giga-sized NT light emitter arrays can be fabricated at 180 nm or smaller critical feature size. Such methods are more fully described in incorporated references, e.g., U.S. Pat. Nos. 6,574,130, 6,643,165, 6,706,402, 6,784,028, 6,911,682, 6,919,592, and 6,924,538; and U.S. patent application Ser. Nos. 10/341,005, 10/341,055, 10/341,054, 10/341,130, and 10/776,059. Second, such nanofabric-based emitting devices scale directly with the lithographic ground rule used, i.e. 180 nm, 130 nm, 90 nm and 65 nm sized emitters can be produced. Third, monolithic CMOS integration of these emitter arrays can be accomplished using the fabrication and integration of self-encapsulated electromechanical switching cavities as described in incorporated references. Passing a current through the suspended nanotube-based fabrics in these nanosized cavities will lead to light emission. Fourth, light emission in these embedded arrays can be individually controlled (turned on/off) by transistors. This is the first demonstration of a manufacturable technology that can be integrated at a level of as few as one light emitter per transistor/memory cell.

Preferred embodiments of the invention allow integration at a level of one light emitter per transistor at minimum dimension at a given lithography node. Monolithic integration of ULSI arrays becomes possible while previously only discrete components could be used as light emitters. Because light emitters can be integrated to form ULSI arrays, thus enabling optical interconnects with one light emitter per transistor, the fabrication of ultradense displays is possible.

Figure 1A:
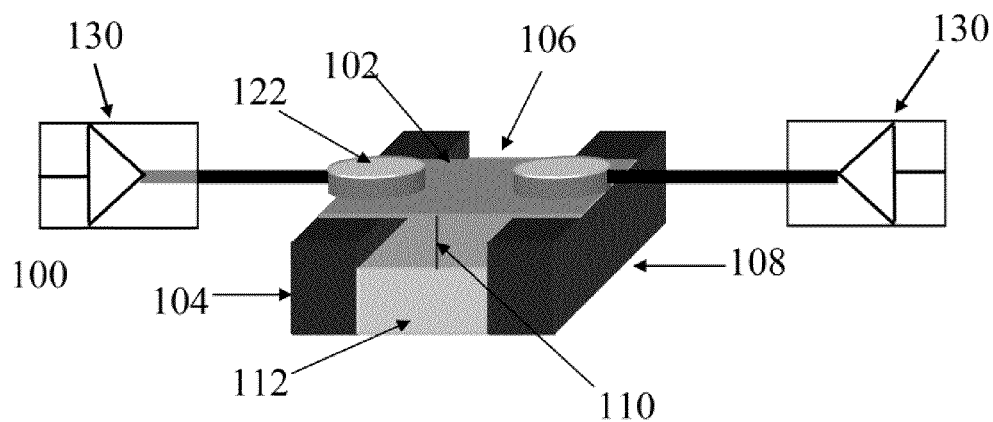
FIG. 1A illustrates an emitting element according to one aspect of the invention.

FIG. 1A illustrates an exemplary light emitting element 100 constructed according to principles of preferred embodiments of the invention. Light emitting element 100 includes a nanotube ribbon 102, a suspended region 106 of nanotube fabric, a gap region 110, a nitride layer 108 comprising one or more supports 104, electrodes 122 and driving circuitry 130.

The nanotube ribbon 102 of certain embodiments is formed from a non-woven fabric of entangled or matted nanotubes (more below).

Supports 104 are patterned out of nitride layer 108. Layer 108 may be of any appropriate material, nitride is given simply as a non-limiting example.

In preferred embodiments, light emitting elements have a suspended region 106 of nanofabric overlying a gap 110, above a second substrate material 112. Each suspended region 106 of nanofabric defines an emitting region of an emitting element 100.

The light emission from the emitting element 102 is controlled by driving circuitry 130. Proper and necessary voltages are described hereinbelow.

Figure 1B:
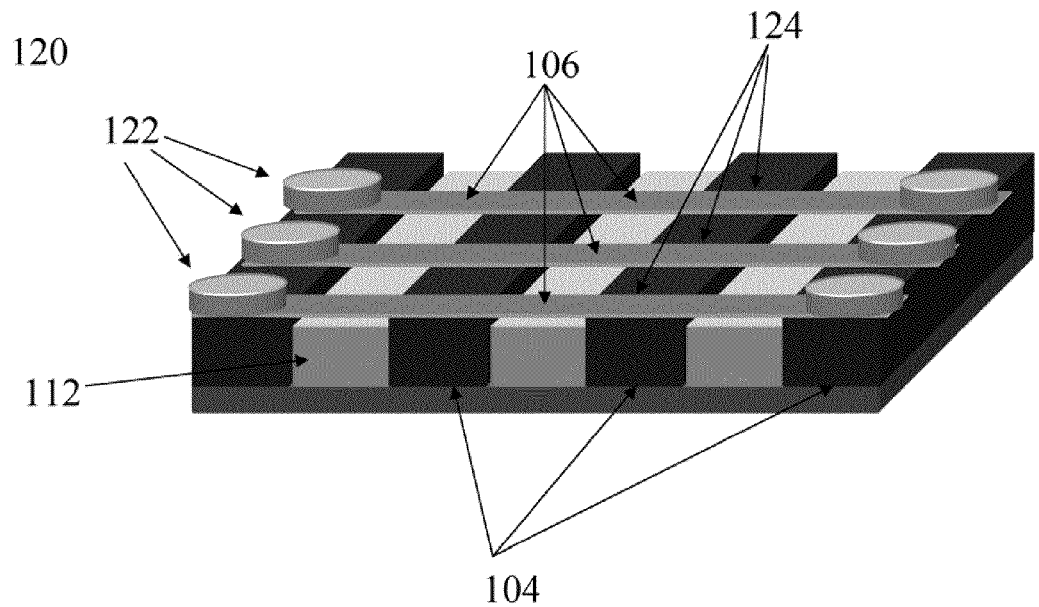
FIG. 1B illustrates an array of emitting elements according to certain aspects of the invention.

FIG. 1B illustrates an array 120 of emitting elements 100.

In array 120, electrodes 122 are connected by nanotube traces 112. FIG. 1A illustrates an array of suspended nanofabric regions 106, each capable of acting as an emitting element 100.

Suspended SWNT devices may be fabricated by spin coating nanotubes onto silicon wafers and patterned into traces which cross perpendicularly 90 nm to 180 nm wide sacrificial layers. Patterning was accomplished using lithography and plasma etch. Subsequently, the SWNT traces were interconnected using metal electrodes. These metal electrodes are positioned at a distance of ~60 nm from the suspended gap. Such fabrication is more fully described in the incorporated references.

Current can be passed through these suspended SWNTs and local heating of these suspended beams can be utilized for applications requiring local, nano-sized heating of devices. While emission of light has been shown to be related to the temperature of nanotubes conducting current, the inventors contemplate that light emitting elements can be associated with varied temperatures.

It is possible to theoretically model the temperatures that can be achieved locally in these suspended SWNT structures, as well as their heating and cooling times. It was found that temperature changes of several hundred Kelvin (° K) can be induced by passing very small currents through these suspended structures (<100 µA). It is also important to note, that these temperature changes take place on very short, even sub-picosecond, timescales.

The present analysis makes the following assumptions: the SWNT thermal resistance and capacitance changes with the SWNT geometry in a bulk fashion; the SWNT electrical resistance does not change with the SWNT geometry (length, cross section); the SWNT contacts are in good thermal contact with a large heat sink; and thermal conduction through the surrounding medium is negligible (adiabatic assumption).

Furthermore, this analysis neglects the following effects as a first order approximation: temperature variation of material properties (SWNT electrical and thermal parameters); radiative and convective heat transfer; and all quantum effects aside from the assumption of constant electrical resistance. The steady-state temperature distribution in a thermally isolated, suspended beam can be determined by solving the Poisson equation $$\nabla^2 T = -\frac{\tilde{P}}{\kappa}$$

in the volume of the beam, where $\tilde{P}$ is the volumetric thermal input power density and $\kappa$ is thermal conductivity. Assuming cross-sectional uniformity of the beam allows the equation to be solved in one dimension. For a tube of length L and a constant power source term, the boundary conditions $T(0)=T(L)=T_0$ yield a parabolic steady-state temperature distribution along the length of the beam:

$$T(x) = T_0 + \frac{P}{\kappa A}x - \frac{P}{\kappa A L}x^2$$

where $P=I^2R=V^2/R$ is the total thermal power input. The maximum temperature rise occurs at the center point of the beam:

$$\Delta T_M = T(L/2) - T_0 = \frac{PL}{4\kappa A}$$

Applying the following parameters:

Electrical resistance R=100 kΩ

Thermal conductivity κ=6600 W/m° K (See Popov, Valentin, "Carbon nanotubes: properties and applications." Mat Sci Eng R 43:3 (2004), 61-102).

Tube outer radius r=0.70 nm [(10,10) SWNT]

Tube wall thickness t=0.34 nm[1] (graphite layer spacing; accepted value for SWNT wall thickness)

Cross-sectional area of tube $A=\pi[r^2-(r-t)^2]=1.13\times10^{-18}$ m$^2$ Specific heat $C_v$=650 J/kg° K 1, 3 (See Popov above and Hone et al., "Quantized Phonon Spectrum of Single-Wall Carbon Nanotubes", Science 289, 1720 (2000).)

Mass density $\rho_m$=3500 kg/m$^3$ [diamond] (This is the mass density for bulk diamond, which should approach the density of a single graphene sheet. This represents a worst-case thermal time constant among carbon allotropes, which is sufficient for a rough estimate of the transient properties.)

we can make an estimate of:

$$\Delta T_M = I^2 L \cdot 3.352\times10^{18} \, K/m\text{-}A^2$$

Table 1 shows some temperature rises for a number of suspended nanotube lengths L:

TABLE 1

| L | I [µA] | V [V] | P [µW] | $\Delta T_M$ [° K] |
|---|---|---|---|---|
| 90 nm | 1.0 | 0.1 | 0.1 | 0.03 |
| | 10 | 1.0 | 10 | 30.2 |
| | 100 | 10.0 | 1000 | 3020 |
| 130 nm | 1.0 | 0.1 | 0.1 | 0.04 |
| | 10 | 1.0 | 10 | 43.6 |
| | 100 | 10.0 | 1000 | 4360 |
| 180 nm | 1.0 | 0.1 | 0.1 | 0.06 |
| | 10 | 1.0 | 10 | 60.3 |
| | 100 | 10.0 | 1000 | 6030 |

It is likely that thermal variance in material properties and radiative cooling will result in significant variance from this simple model at extreme temperatures. However, significant temperature rises can be affected with only modest currents. It should also be noted that the resistance of the SWNTs will increase with temperature (with a temperature coefficient of approximately 1000 ppm resistance increase per degree with increasing temperature). This effect will be very dominant especially at high temperatures and is factored into the nanotube emitter design.

To gain a rough understanding of the thermal switching speed of a suspended SWNT, the thermal resistance and capacitance seen between the point at the center of the tube and the two contacts can be estimated. As a fabric is appropriately heated, it emits light and stops emitting light as the temperature fabric temperature decreases.

Using the above parameters, and accounting for the two identical parallel resistances and capacitances, the calculations are as follow:

$$R_T = \frac{1}{2} \cdot \frac{L}{2} \cdot 134\times10^{12} \; °K/W\text{-}m = L \cdot 33.5\times10^{12} \; °K/W\text{-}m$$

$$C_T = 2 \cdot \frac{L}{2} \cdot 2.57\times10^{-12} \; J/°K\text{-}m \quad C_T = L \cdot 2.57\times10^{-12}$$

$$\tau_T = R_T C_T = L^2 \cdot 86.1 \; s/m^2$$

Table 2 shows how nanotube length, L corresponds to thermal switching speed, $\tau_T$.

TABLE 2

| L [nm] | $\tau_T$ [ps] |
|---|---|
| 90 | 0.7 |
| 130 | 1.5 |
| 180 | 2.8 |

While more refined computations would take into account the full solution to the time-dependent heat flow equation, this brief estimate shows that we can expect attractively fast, picosecond thermal switching times from suspended SWNT light emitting elements. Also, importantly, large temperature changes can be induced by small currents (<100 uA) through the suspended SWNTs.

Methods of making suspended nano-fabrics suitable for certain embodiments of the invention are disclosed in the incorporated patent references, including U.S. Pat. No. 6,706,402 and U.S. patent application Ser. Nos. 10/776,059 and 10/776,572 and WO 01/03208. Nanofabric ribbons or segments or belts made from a matted layer of nanotubes or a non-woven fabric of nanotubes are used as a conductive element which emits light. At points in this disclosure, the ribbons are referred to as traces or emitting or conductive articles. In some instances, the ribbons are suspended, and in other instances they are disposed on a substrate.

Under certain embodiments of the invention, the conductive articles may be made from a nanotube fabric, layer, or film. Carbon nanotubes with tube diameters as little as 1 nm are electrical conductors that are able to carry extremely high current densities, see, e.g., Z. Yao, C. L. Kane, C. Dekker, Phys. Rev. Lett. 84, 2941 (2000). They also have the highest known heat conductivity, see, e.g., S. Berber, Y.-K. Kwon, D. Tomanek, Phys. Rev. Lett. 84, 4613 (2000), and are thermally and chemically stable, see, e.g., P. M. Ajayan, T. W. Ebbesen, Rep. Prog. Phys. 60, 1025 (1997). However, using individual nanotubes for light emission can be problematic because of difficulties in growing them with suitably controlled orientation, length, and the like. Creating traces from nanotube fabrics allows the traces to retain many if not all of the benefits of individual nanotubes. Moreover, traces made from nanotube fabric have benefits not found in individual nanotubes. For example, since the traces are composed of many nanotubes in aggregation, the trace will not fail as the result of a failure or break of an individual nanotube. Instead, there are many alternate paths through which electrons may travel within a given trace. In effect, a trace made from nanotube fabric creates its own electrical network of individual nanotubes within the defined trace, each of which may conduct electrons. Moreover, by using nanotube fabrics, layers, or films, current technology may be used to create such traces.

Because creation of new nanotube-based emitting elements is like fabrication of suspended nanotube-based memory elements described in incorporated documents, the current description of their architecture is brief. Reference may be made to U.S. Pat. No. 6,706,402, and U.S. patent application Ser. Nos. 10/341,005, 10/341,055, 10/341,054, 10/341,130 and to WO 01/03208 for fuller description and background.

Figure 2:
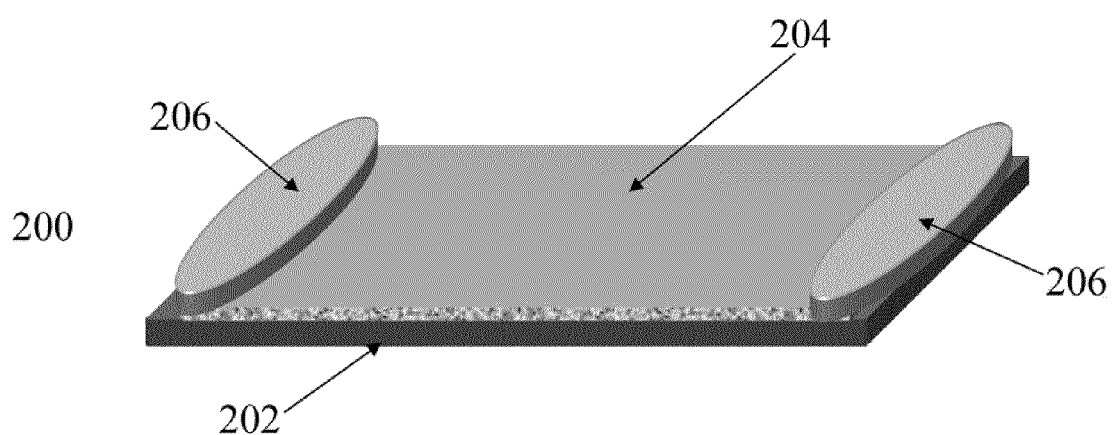
FIG. 2 illustrates an emitting element according to one aspect of the invention.

FIG. 2 illustrates a large scale light emitter 200 according to one aspect of the present invention. The large scale emitter 200 has a porous substrate 202, a nanotube fabric 204 and electrodes 206.

The porous substrate 202 may be any appropriate porous material, including but not limited to paper, including filter paper.

The nanotube fabric 204 is disposed on the substrate and may be created by spin coating, patterning and lithographic etching as described in incorporated references.

Electrodes 206 are disposed on the fabric of the emitter such that current can pass through the fabric, between electrodes 206.

Such a large scale emitter takes advantage of the porous nature of the substrate 202 in that light can be emitted from suspended nanotube fabric regions lying over pores in the substrate. The pores need not be uniformly distributed, and materials such as filter paper may be used as a porous substrate. Applications for such light emitters include backlighting displays for hand held personal data assistants (PDAs), games or any other electronic device requiring such backlighting.

Fabrication of light emitting elements are analogous to those fabrication techniques fully described in U.S. Pat. No. 6,706,402 and U.S. patent application Ser. Nos. 10/341,005, 10/341,055, 10/341,054 and 10/341,130 which are incorporated by reference in their entireties.

Figure 5:
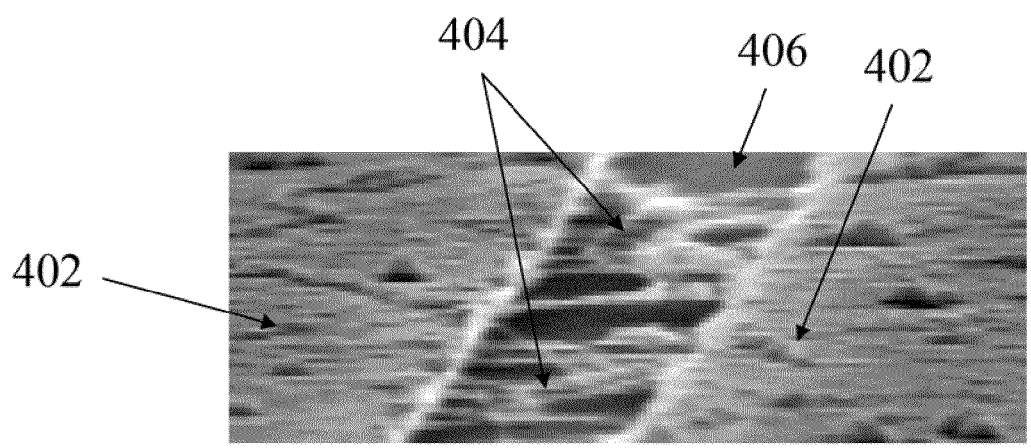
Figure 6:
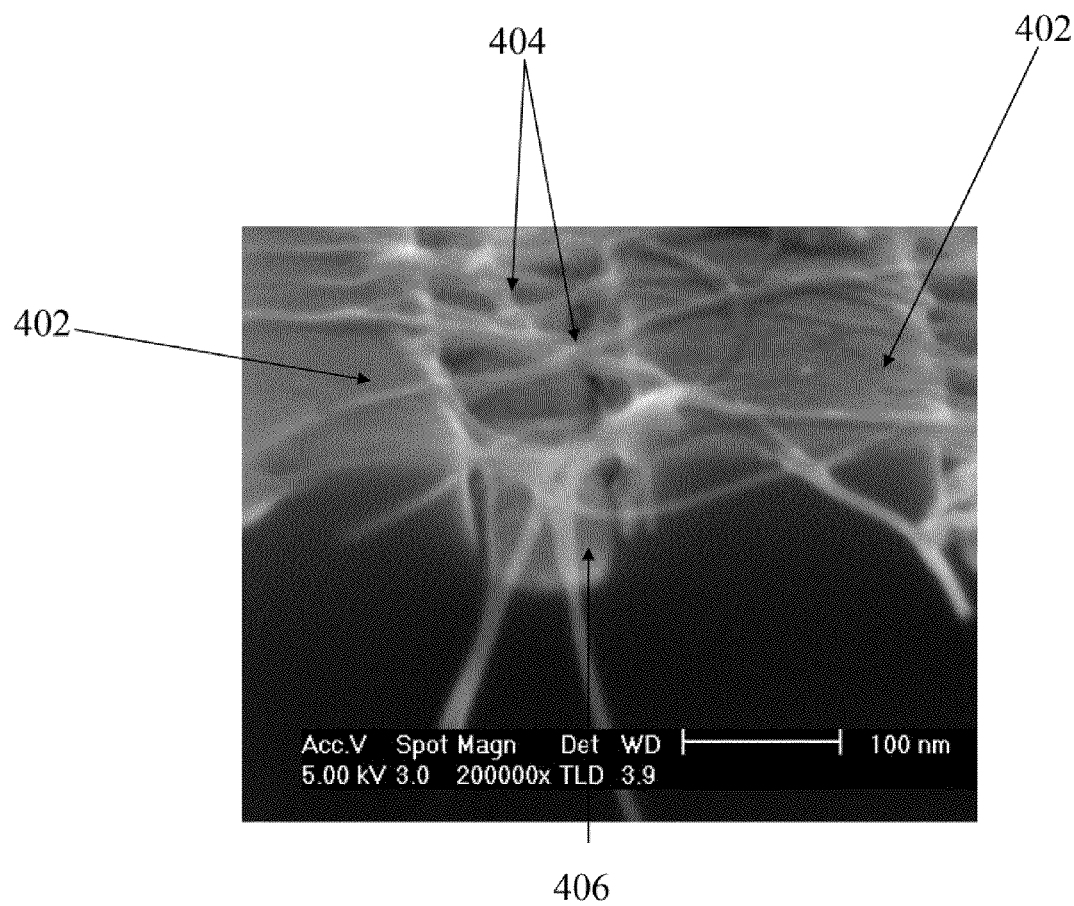
FIG. 6 illustrates an exemplary patterned article.

FIG. 5 is an Atomic Force Microscopic (AFM) image of an exemplary nanotube fabric 312. In this figure, each nanotube is about 1.5 nm in diameter. (The image is fuzzy due to the inherent limitations in the microscopy, not due to the actual texture of a given nanotube.) This image is at the lateral resolution limit of AFM.

Though most of the disclosure above is written as if the fabric were made of nanotubes of the same type, e.g., all single-walled, the fabrics may be composed of all multi-walled structures or of a combination of single- and multi-walled structures.

Figure 3:
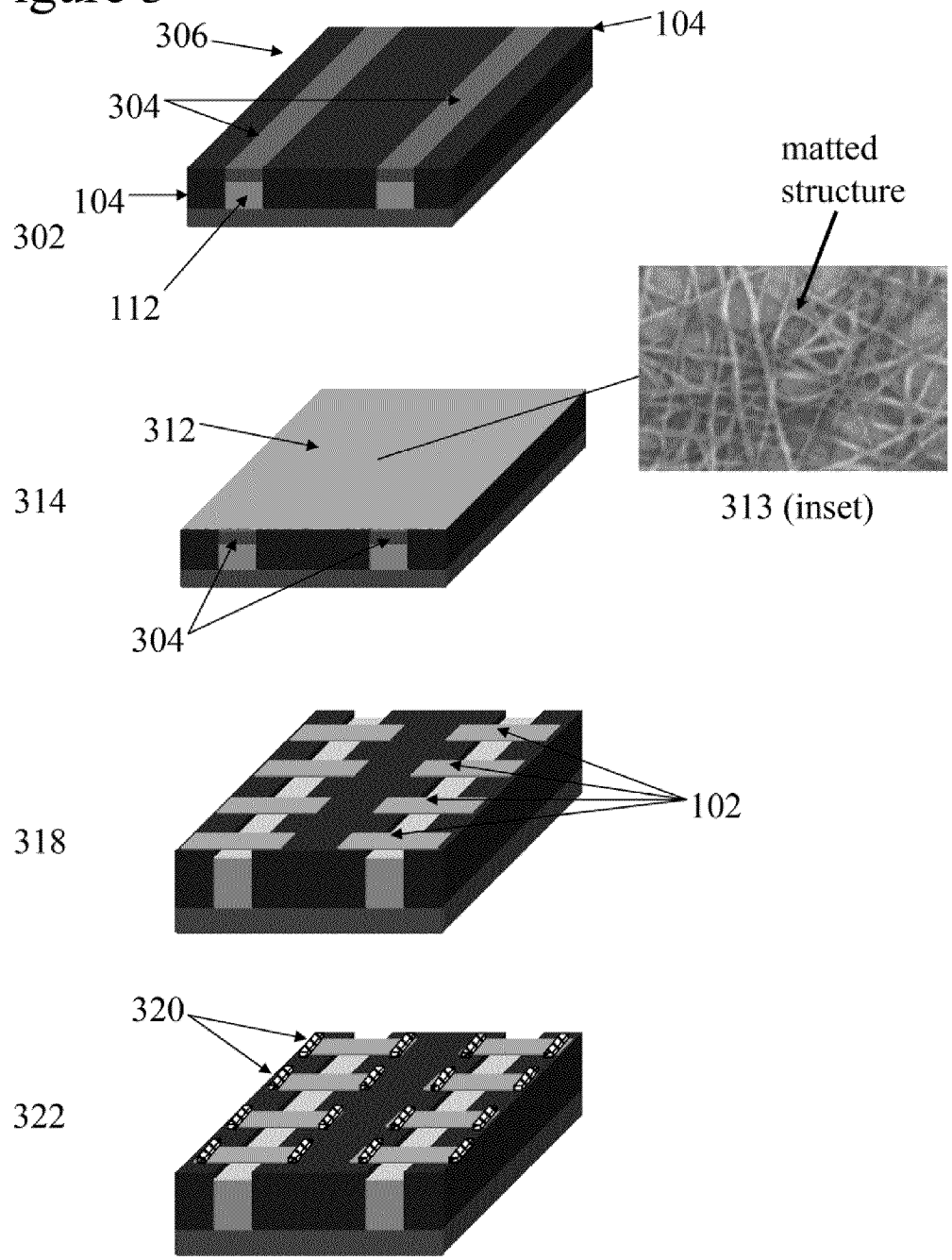
FIG. 3 illustrates steps in a method of fabricating emitting elements according to one aspect of the invention.
Figure 4:
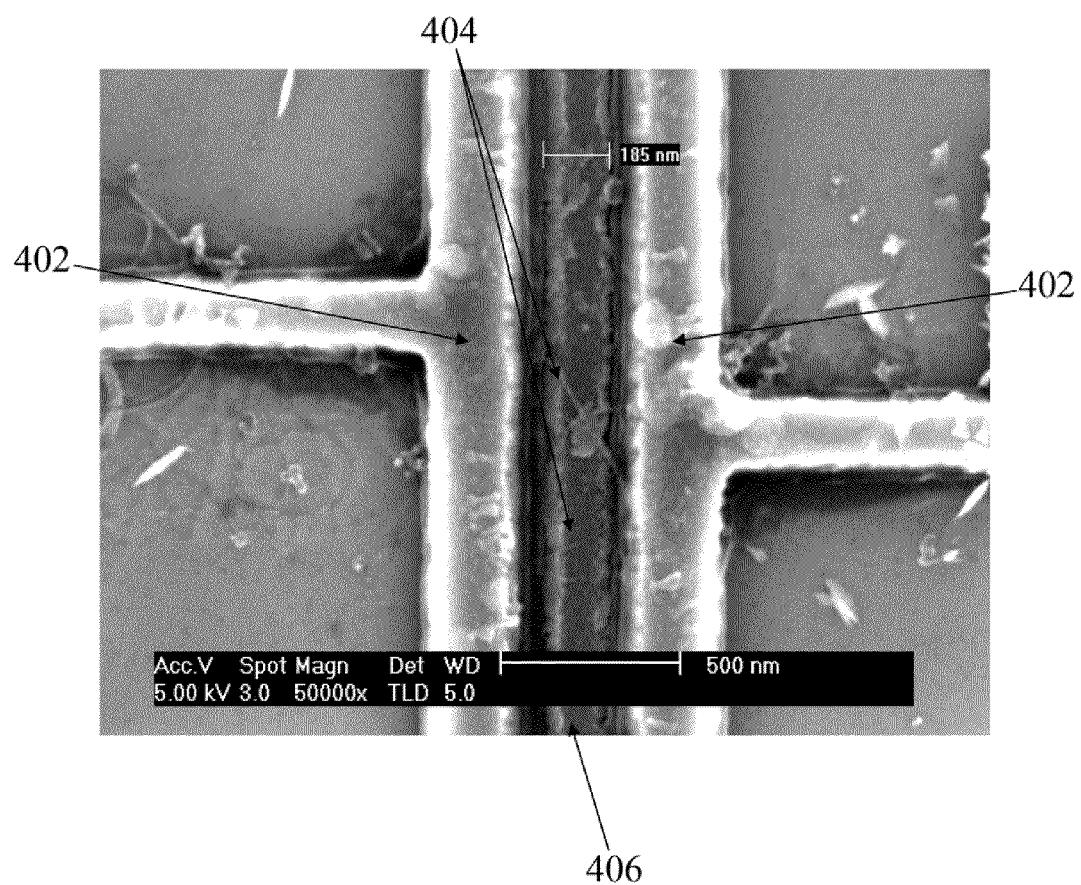
FIGS. 4 and 5 illustrate exemplary nanofabric articles.

The above embodiments of nanotube-based emitting elements use traces or electrically conductive articles made from nanotube layers 312, such as those shown in FIGS. 2 and 3. The layers may have thickness of about 1 nm or less, i.e., the thickness of a given nanotube. The nanotube matte 312 is grown or deposited on a surface, such as that of a silicon wafer, to form a contiguous film of a given density. The same two dimensional film that is patterned into discrete emitting elements can also be patterned to generate conductively interconnecting traces ranging in width from 1 nm (the intrinsic minimum size of a nanotube) to hundreds of microns or greater, depending on the application and context, as well as other electronic elements as described in incorporated references, including, but not limited to: transistors, triodes and memory elements. The 1 nm minimum size corresponds to a film which ever patterning had a single nanotube left in the article. More typically, the lower dimension sizes are a consequence of lithographic technology limitations and not any limitations inherent in the preferred embodiments of the invention.

Light emitting elements may be suspended as stated above, or they may lie on surfaces of materials whose thermal properties are less conductive. Such materials include, but are not limited to: insulators and thermally conductive elastomers The NTs heat up to the point that they start to glow and emit light when they are suspended over a gap in air/gas, but a fabric of nanotubes may be used as an emitting element when the fabric is disposed on a substrate (at any orientation, not only horizontally as the figures may indicate). Fabrication of such non-horizontally oriented nanotube-based fabrics is more fully described in U.S. Pat. No. 6,924,538 which is incorporated by reference in its entirety, and fabrication will not be repeated here for the sake of brevity.

The thermal conductivity of the substrate plays an important role in the emissive properties of the nanofabric.

Exemplary substrates on which emitting nanotube elements may be disposed include, but are not limited to the items listed in table 1 which lists materials and thermal conductivities in W/cm-° K at room temperature (300° K).

Insulators
    Silicon Nitride 0.3
    Silicon Oxide 0.014
    Silicon Carbide 1.2
    Silicon 1.4
    Epoxy 0.002
    Thermally conductive epoxy 0.008
    Glass 0.008
    Heat sink compound (metal oxide loaded grease) 0.004
    Mica 0.007
    Mylar 0.002
    Phenolic 0.002
    Silicone Grease 0.002
    Silicone Rubber 0.002
    Teflon 0.002
    FR-4 or G-10 PC board material 0.003
Thermally Conductive Elastomers
    Bergquist Sil-pads 0.009
    Tecknit Consil-R 350 0.00433 to 0.00732
    Saracon 2.9e-3 cal/cm-sec-° K
    Chomerics XTS-274 alumina filled elastomer 0.002 cal/sec cm ° K Light emitting nanofabrics can be used as opto-isolators. Such an opto-isolator is useful in relay-type applications for isolating input to output. FIG. 7A illustrates a prior art LED and photo diode. The LED electrical input electrodes 702 and 704 activate electrical input 700 of LED 712 sending a current through LED 712 and LED 712 generates an optical (radiation) output signal 714. LED optical output signal 714 impinges on photodetector 710 and photodetector 710 generates output 716 as a voltage between output electrodes 706 and 708

FIG. 7B illustrates an opto-isolator according to one aspect of the invention. The nanofabric electrical input electrodes 702' and 704' activate electrical input 700' of nanofabric emitting element 712' sending a current through nanofabric emitting element 712'. Nanofabric emitting element 712' having resistance R (R is a function of temperature and increases at high temperatures) receives electrical power $I^2R$ from electric current I and is heated to the point of optical (radiation) output. For emission by resistive heating, the heating efficiency of the nanofabric emitting element 712' is enhanced by reducing thermal conduction from the film to adjacent regions that may act as a heat sink. By way of example of reduced thermal conduction, the nanofabric emitting element 712' is that portion of the nanofabric element in a gap (void) region as illustrated further below. Alternatively, nanofabric emitting element 712' is that portion of the nanofabric element supported by (in physical contact with) a layer of low thermal conductivity such as polyimide with a thermal conductivity of 0.004 W/cm-° K and epoxy glass with a thermal conductivity of 0.003 W/cm-° K, as well as other low thermal conductivity materials as shown in Table 3. The spectrum of the light output contains wavelengths in the infrared, visible, and (in some high temperature embodiments) ultraviolet regions of the spectrum. The current I may be adjusted to control the input power $I^2R$ to nanofabric emitting element 712' to emit more (or less) optical (radiation) energy in the infrared, visible, or ultraviolet regions of the spectrum as a function of the optical (radiation) detector requirements as illustrated further below. In an optical isolator application illustrated in FIG. 7B, nanofabric emitting element 712' optical (radiation) output 714' impinges on a surface of optical detector 710'. Examples of optical detectors are p-n photodiodes as discussed in Kwok K. Ng, "Complete Guide to Semiconductor Devices," IEEE Press, John Wiley & Sons, 2002, pages 435 and 426, and p-i-n photodiodes as discussed in the Ng reference, pages 431-434, that display p-i-n photodiodes operational frequencies in excess of 30 GHz. Photodetector (photodiode) 710' may be used to generate output signal voltage 716' on output terminals 706' and 708' analogously to the prior art system, however nanofabrics can be made to smaller scales than current LEDs and integrated with silicon technology. Electrodes 702' and 704' control the current through input 700' while electrodes 806' and 808' provide output voltage through output 716'.

Figure 8A:
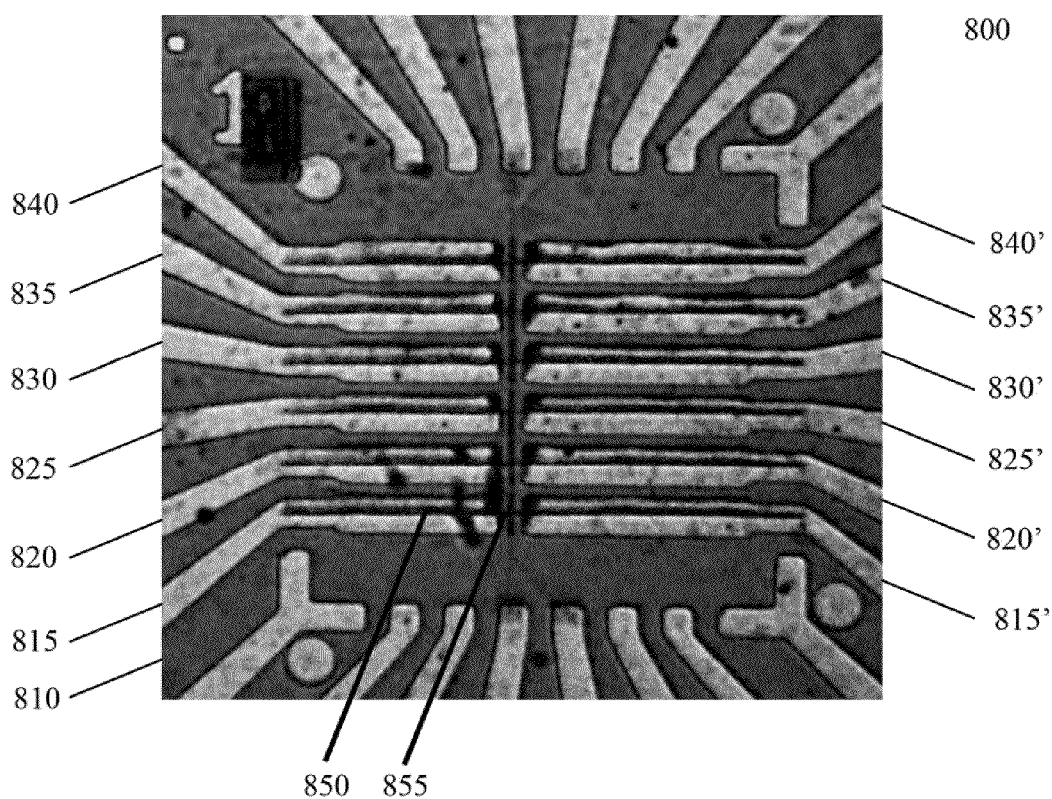
FIG. 8A illustrates a substrate containing nanotube fabric emitters connected to conductor pairs.

FIG. 8A illustrates a substrate 800 containing six single nanotube fabric emitters each connected to a conductor pair (pair of conductive traces). Substrate 810 consists of a silicon substrate with an oxide insulating layer of 500 nm thickness. Trenches of approximately 130 nm by 3 to 5 um are etched in the oxide layer to form (define) the thermally insulated light emitter region of the nanotube fabric element (depth is not critical). The trenches are temporarily filled with PMA (e-beam photoresist), a single wall carbon nanotube fabric layer is deposited on the surface and patterned using a hard photoresist mask, the nanotube fabric layer is etched, and the photoresist is removed. Conductor pairs 815 and 815', 820 and 820', 825 and 825', 830 and 830', 835 and 835', and 840 and 840' are deposited on the patterned nanotube fabric layer and patterned as illustrated in FIG. 8A. The conductor pairs in contact with the patterned nanotube fabric are formed using 1-3 nm thick nickel and approximately 100 nm thick palladium. A trench region is formed under the nanotube layer in the gap region between conductor pairs by removing (etching) the PMMA resist in the trench thereby completing the nanotube emitter region. The nanotube emitter region is approximately 130 nm long and 3 to 5 um wide. An electrical current is made to flow between conductor pairs and the emitter region is heated and emits light. For example, a dc voltage of approximately 5 volts may be applied between the terminals of conductor pair 815 and 815' in contact with nanotube fabric element 850 with a current flow of approximately 200 micro-Amperes (uA) resulting in emission from nanotube emitter 855 having a typical nanotube emission spectrum 860 illustrated in FIG. 8B. The optical detection (measurement) apparatus (not shown) includes a mechanical XY table, a diffraction grating, several lenses, and an intensified ICCD (Princeton Instruments—frame transfer Pentamax 512×512×2 pixel array coupled to a Gen IV Intensifier) with an epi-illumination inverted microscope (Nikon Diaphot-TMD). The emitted photon output power is estimated as 1.3 pW of photon energy per 1 mW of input power. It should be noted that the nanotube emitter structure has not been designed for optimum power output. More details are given further below.

Figure 8B:
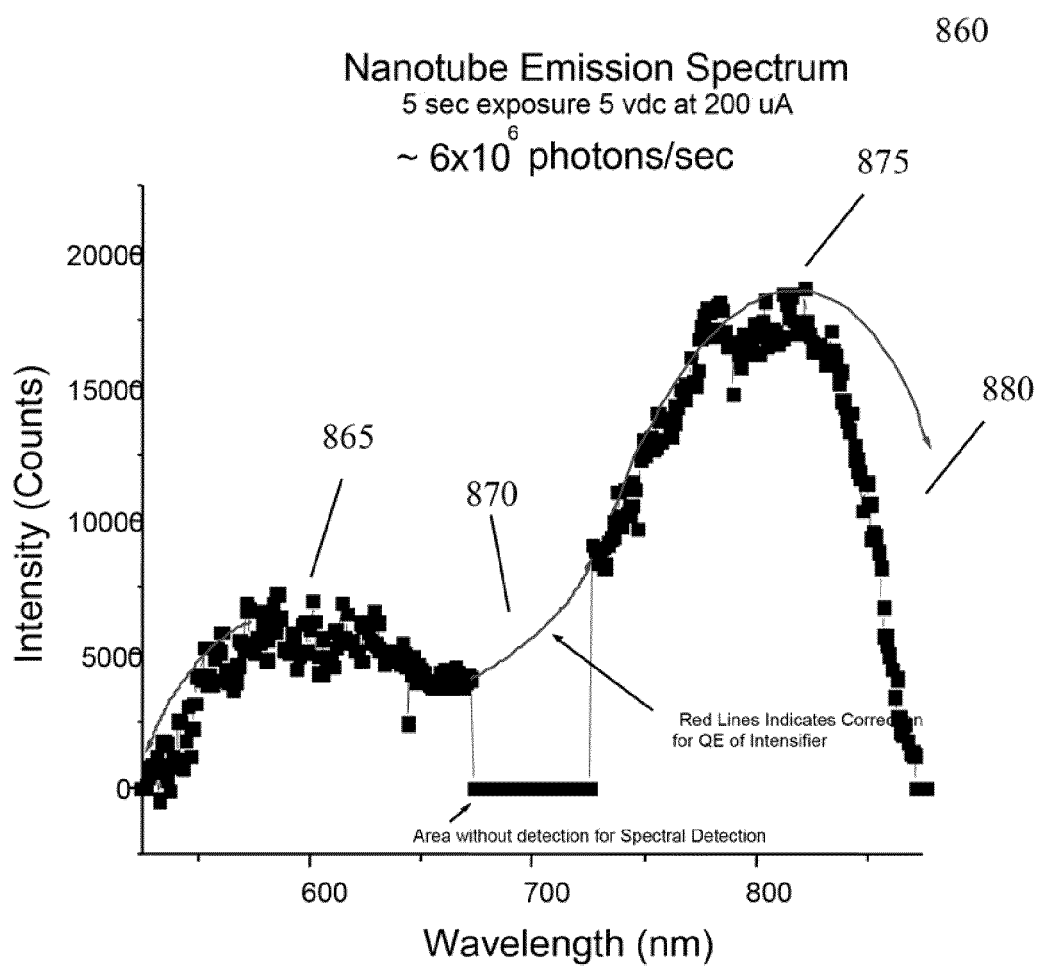
FIG. 8B illustrates nanotube emitters and resulting spectral outputs.

FIG. 8B illustrates the nanotube emission spectrum 860 over a broad range of output wavelengths from 500 nm to in excess of 850 nm. Spectral output region 865 is in the visible range of the spectrum. Region 870 shows no spectral output because the optical measurement apparatus does not detect this portion of the spectrum. Spectral output region 875 is in the near infrared region of the spectrum. Spectral output region 880 shows a rapid reduction in output emission for wavelength regions beyond approximately 825 um. This rolloff is a function of the wavelength limitations of the optical measurement apparatus in the infrared region. The nanotube emitters are expected to emit photons in the infrared region of the spectrum without exhibiting this sharp roll-off. An optical measurement apparatus designed for infrared measurements was not available.

FIG. 8A illustrates a column of six nanotube emitters, and FIG. 8B illustrates the spectral output of one of these emitters. However, more than one emitter may be activated simultaneously; all emitters may activated simultaneously. The emitters may be activated using a dc or a pulsed source. An entire wafer may be filled with nanotube emitters and some or all of the emitters may be activated to create a light source. The light source may be a white or near-white source because of the broad nature of the emitter spectrum. Near-white light sources are desirable for many applications. Nanotube emitter near-white light sources can provide an advantage over LEDs because creating a near-white light source requires the use of several LED devices of different wavelengths activated in parallel. LEDs are typically discrete devices formed using various compound semiconductor materials such as GaAs, AlGaAs, GaAsP, etc. and do not integrate well with silicon technology, while nanotube emitters integrate well with silicon or virtually any other substrate material. Also, nanotube emitters also emit in the infrared portion of the spectrum. An infrared light source is available from the back of the wafer because only wavelengths longer than 1.1 to 1.2 eV can propagate through the silicon substrate material. The substrate material may be changed to accommodate various wavelength filtering characteristics.

Nanotube emitters integrate well with silicon. Photodiode detectors capable of detecting the optical spectrum of nanotube emitters also integrate well with silicon. FIG. 9 illustrates a nanotube emitting and photodiode detecting integrated structure 900 having a nanotube emitting source 908 integrated with a p-n photodiode 914, with depletion region 912. Terminals 901 and 902 are in electrical contact with nanotube element 907 and are used to supply current through nanotube element 907 to nanotube emitter region 908 in cavity 906. Terminals 901 and 902 correspond to terminals 815 and 815' in FIG. 8A, nanotube element 907 corresponds to nanotube element 850, and emitter 908 corresponds to emitter 855, also illustrated in FIG. 8A. Photodiode detector 914 is located in substrate 916 corresponding to silicon substrate 810 in FIG. 8A. Photodiode detector 914 output voltage appears between photodiode output terminals 903 and 904 activated by nanotube spectral emission 910 corresponding to spectral emission 860 shown in FIG. 8B.

Nanotube emitting and photodiode detecting integrated structure 900 may be used to form a carbon nanotube optoisolator as illustrated in FIG. 7B. Terminals 901, 902, 903 and 904 correspond in function to terminals 702', 704', 706' and 708' respectively. Gap 906 is shown surrounding emitting region 908 of nanofabric 907, and corresponds to nanotube emitting region 712' in FIG. 7B. Photodiode detector 914 in FIG. 9 corresponds to photodiode detector 710' in FIG. 7B. An advantage to using this integrated nanotube emitting and photodiode detecting integrated structure 900 is that integrated system elements such as the nanotube emitter and photodiode detector are easily aligned (stacked), nanotube driver and photodiode detector circuitry, and other circuits may also be fully integrated, resulting in lower fabrication (manufacturing costs), better reliability, and higher density (assembly fits in a smaller space, etc.).

Figure 10:
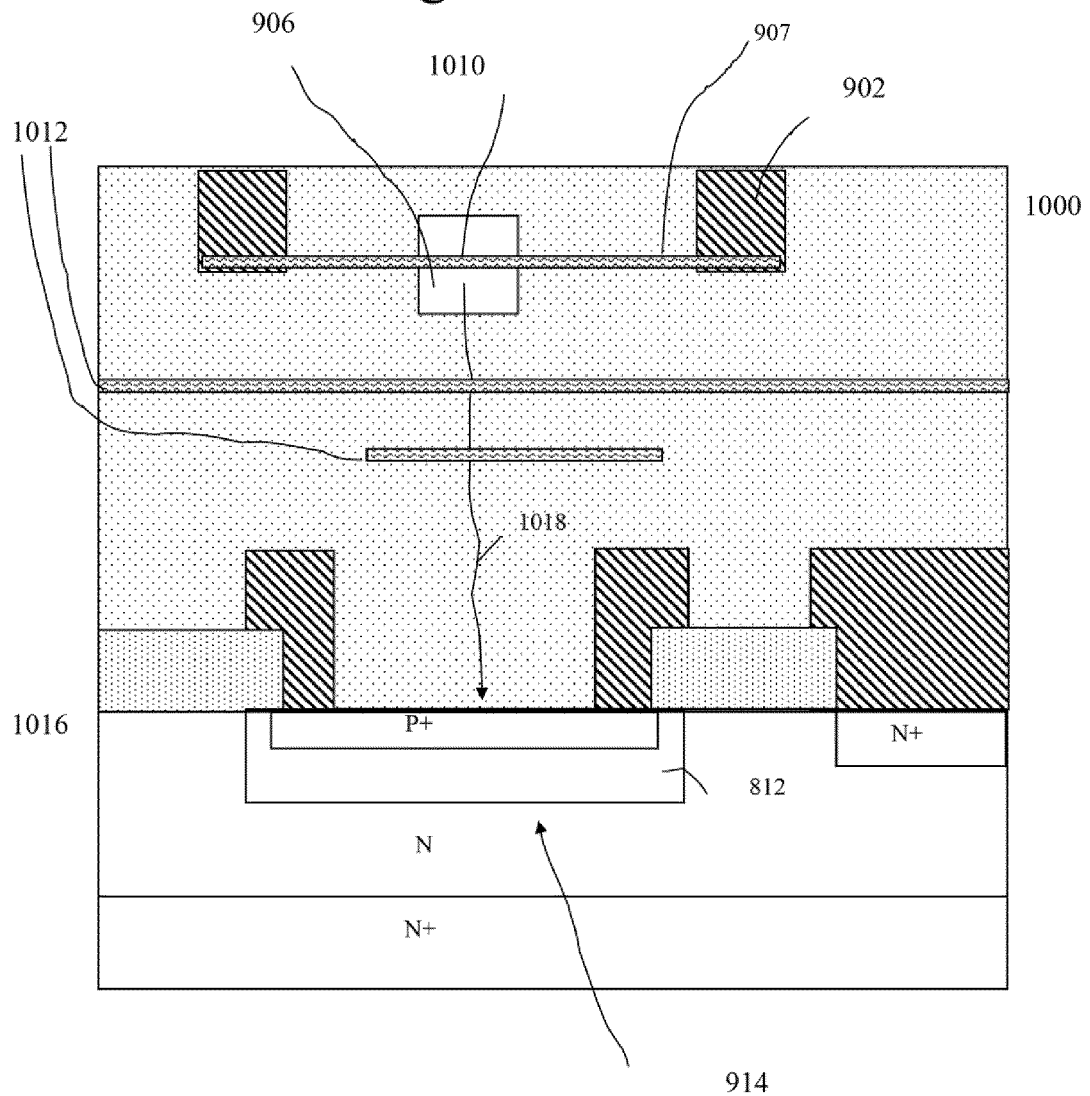
FIG. 10 illustrates an integrated nanotube optical driver and optical receiver.

FIG. 10 illustrates a CNT radiation emitting on-chip integrated optical driver and receiver which operate by sending a signal through porous NT fabric to drive a circuit in silicon layer. The light emitter 1000 having a light emitting region 1010 overlying porous wiring layers 1012 and driving through the wiring layers 1012 to the chip region 1016 by radiative signal 1018. This is a representation of a use for the light emitted from nanofabrics to drive from one portion of a chip to another.

Figure 11:
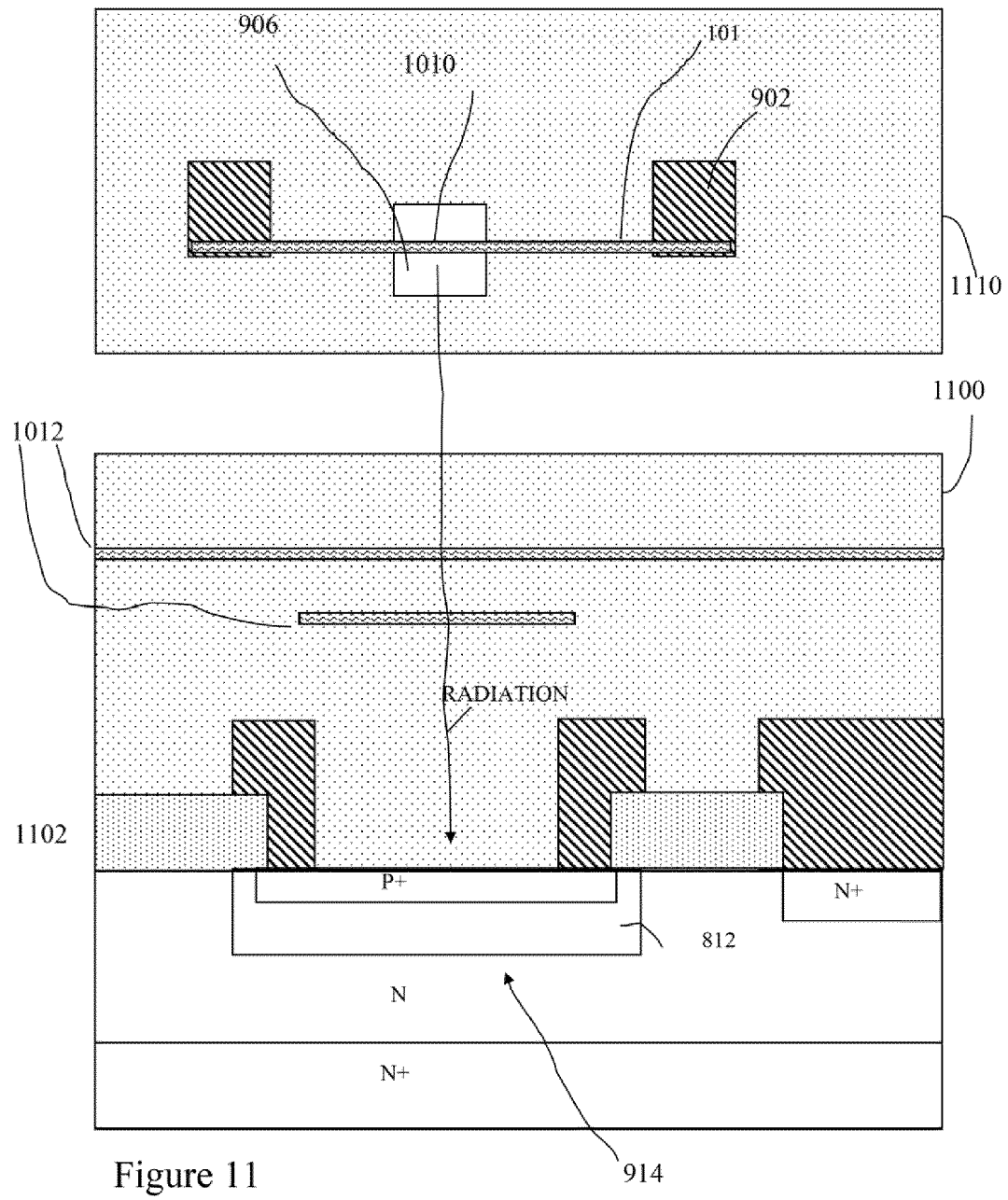
FIG. 11 illustrates a first chip-to-chip optical driver.

FIG. 11 illustrates chip-to-chip optical driver 1100. The driver 1100 is shown sending a signal in order to drive a p-n photodiode integrated device 914 on second chip 1102; the signal travels through the porous layer of the nanofabric 1104. This system takes advantage of the porous nature of nanofabrics and the light transmitting properties of the silicon oxide substrate.

Figure 12:
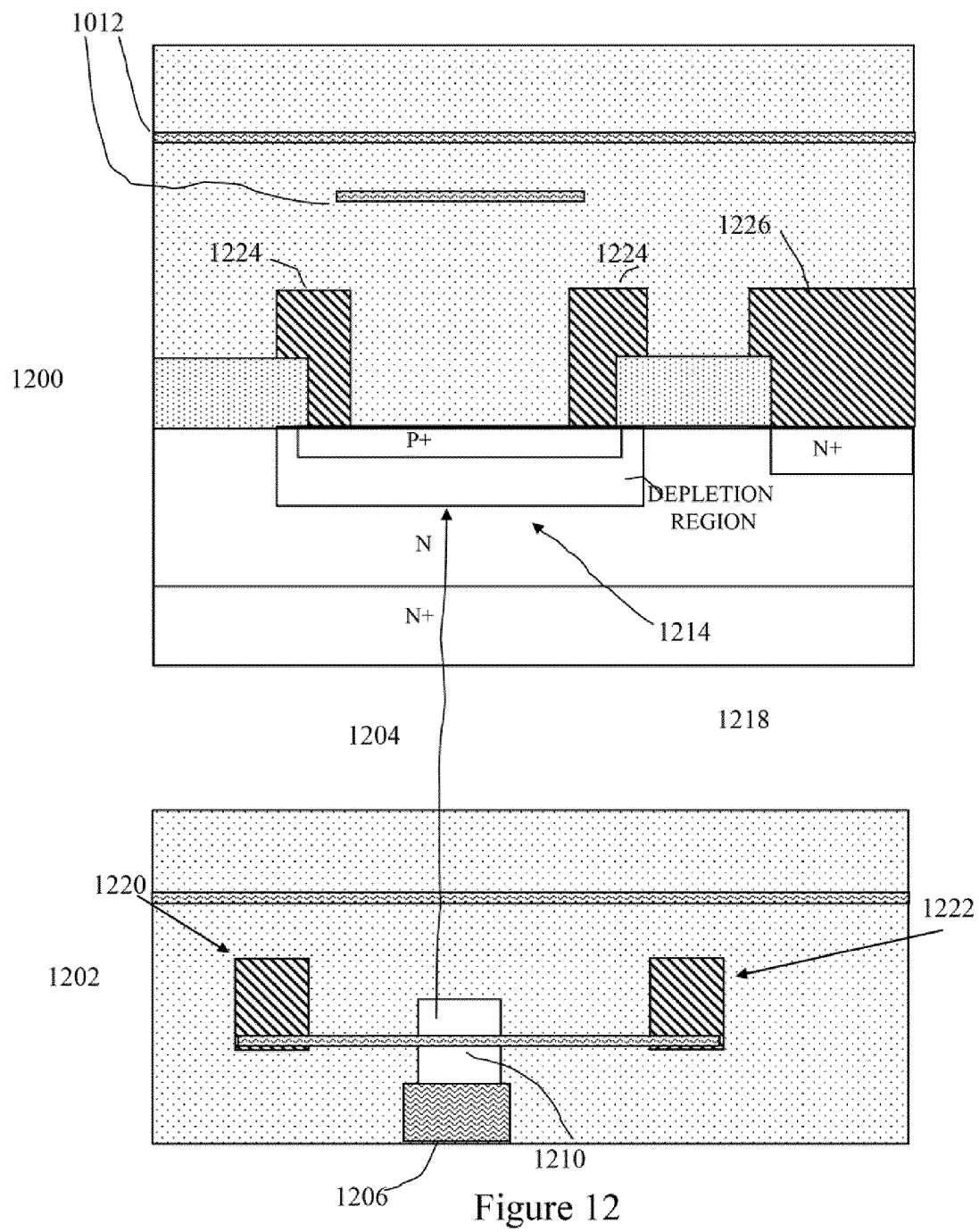
FIG. 12 illustrates a second chip-to-chip optical driver.

FIG. 12 illustrates emitted light 1204 sent as a signal sent from the emitting region 1210 of a first chip 1202 to the photodiode region 1214 of a second chip 1200. An advantage of this integrated system is that while it works in silicon and silicon oxide, the signal is able to pass through porous nanofabric elements, when used, and such devices can be fabricated with current technology and in present day fabrication facilities. Optional optical reflector 1206 is shown concentrating emitted light. Terminals 1220, 1222, 1224 and 1226 are functionally analogous to terminals 901, 902, 903 and 904 respectively. One skilled in the art will understand that the use of lenses (not shown) can be used to further concentrate the emitted light. A nanotube emitter 1204 sends a signal from chip 1202 to the p-n photodiode integrated device of chip 1200. The signal is concentrated by the reflector 1206. In this example, nanotube emitted light 1204 is transmitted through the back of silicon substrate 1218. Nanotube emitted light 1204 with energy in the infrared region with wavelengths longer than approximately 1.2 um can propagate through silicon and impinge on photodiode detector 1214.

Example 1

In this example, an addressable array of light emitting, suspended nanofabric articles is created. The setup is divided into three main parts:
the electrical control setup,
the chip holder; and
the optical detection setup.

The electrical control setup consists of a data acquisition system based on a National Instruments PCI-16XE-MIO-10 multipurpose DAQ card, with a BNC-2110 interface board. The DAQ card interface was written using National Instrument's Measurement Studio (Ver. 1.0) and Nidaq 7.01 with Microsoft's Visual Basic (Ver. 6.0). The electrical output (DAC0) goes through a Keithley 485 Pico-ammeter in order to measure the current going through the nanotube.

The electrical connections go through an interface connection with a sample holder (chip holder) designed to hold the 28 pin chips. The chip is has Argon gas flowing over the junction area (shown by the yellow tube going under the holder.

The optical detection setup consists of an Inverted microscope (Nikon Diaphot-TMD) using a 40×, (160 mm tube length, 0.95 NA, Air) objective. At the front optical port is placed an intensified ICCD Pentamax (512×512×2 pixel Pentamax 512×512×2 pixel array coupled to a Gen IV Intensifier, high-speed frame-transfer) camera. In order to see a chip, a fiber light source is coupled into the setup in an epi-illumination manner using a wide field illumination scheme. Voltage was scaled from −10 to +10 VDC to obtain an I-V curve. Take an image of the active chip area then with all junctions shown, this involved turning on a homebuilt epi-illumination source with a fiber light with the number of photons greatly attenuated due to the high sensitivity of the imaging camera.

Figures 13A, 13B:
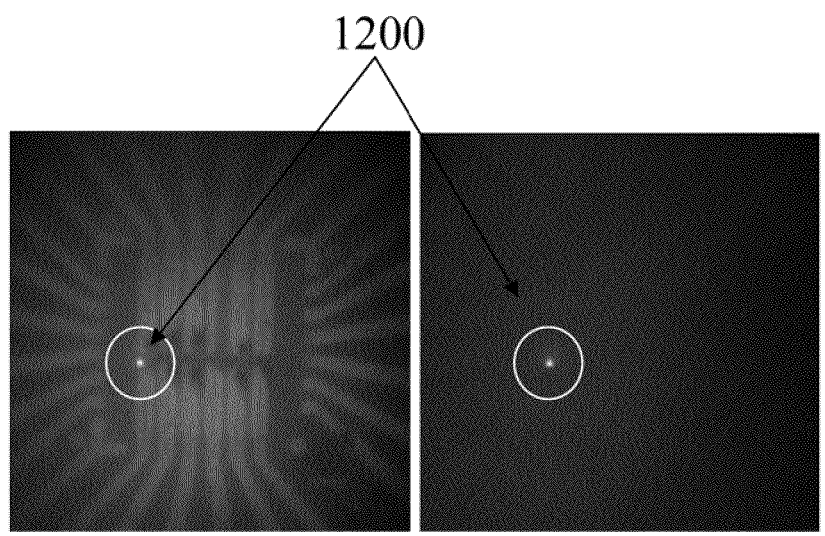
FIG. 13A illustrates a light emission from a nanotube emitter.
FIG. 13B also illustrates a light emission from a nanotube emitter.

FIG. 13A shows bright emission 1300 at −10 VDC (combined area image with light emission). FIG. 13B shows light emission after 5 minutes.

Light emitters can be constructed using suspended or non-suspended nanotube-based fabrics in combination with appropriate substrates. Fabrication techniques to develop such horizontally- and vertically-disposed fabrics and devices composed of nanotube fabrics which comprise redundant conducting nanotubes may be created via CVD, or by room temperature operations as described herein and described in U.S. Pat. Nos. 6,574,130, 6,643,165, 6,706,402, 6,784,028, 6,835,591, 6,911,682, 6,919,592, and 6,924,538; and U.S. patent application Ser. Nos. 10/341,005, 10/341,055, 10/341,054, 10/341,130, and 10/776,059, the contents of which are hereby incorporated by reference in their entireties. Light emitting articles may be constructed out of the same fabric layer used to make other electronic elements, including interconnects, logic or memory or simple FETs. Such emitters may be part of a scheme involving signal transmission or use in a display.

Under certain embodiments, the nanotube ribbon 102 may be held in position at the supports by friction. In other embodiments the ribbon may be held by other means, such as by anchoring the ribbons to the supports using any of a variety of techniques. This friction can be increased through the use of chemical interactions including covalent bonding through the use of carbon compounds such as pyrenes or other chemically reactive species. Evaporated or spin-coated material such as metals, semiconductors or insulators especially silicon, titanium, silicon oxide or polyimide could also be added to increase the pinning strength. The nanotube ribbons or individual nanotubes can also be pinned through the use wafer bonding to the surface. (See R. J. Chen et al., "Noncovalent Sidewall Functionalization of Single-Walled Carbon Nanotubes for Protein Immobilization," J. Am. Chem. Soc., 123, 2001, 3838-39 and Dai et al., Appl. Phys. Lett., 77, 2000, 3015-17 for exemplary techniques for pinning and coating nanotubes by metals.) (See also WO01/03208 for techniques.) The ribbons 102 may be held in place by the material used as electrodes 122, e.g., in cases where the electrode material is applied after the fabric is created.

A nanofabric-based light emitter does not have to be described as a single suspended region of nanofabric; a large area of nanofabric may be seen as one light emitter, or as a collection of light emitters which emit many points of light, seen as one by the naked eye. Such a device may be fabricated by applying a fabric onto a porous substrate. A porous substrate is supplied and a fabric of nanotubes is applied to the surface of the substrate. Electrodes may be already in place, when the fabric is applied, or they may be placed into contact with the nanofabric after the fabric is created. The exact placement and geometry of the electrodes will not alter operation of the light emitting sheet, so long as sufficient current is able to pass through the fabric allowing light to be emitted from many points on the fabric. Light emission on such a massive scale can be described as above, i.e. if the substrate is thermally conducting, then light will be emitted from the portions of nanofabric lying over pores, i.e. light will be emitted from the suspended portions of fabric. If the substrate is of sufficiently low thermal conductivity, then both suspended and non suspended regions of nanofabric will emit light. Exemplary placement of electrodes is shown in FIG. 2.

In order to fabricate the nanotube ribbon 102 of certain embodiments is formed from a non-woven fabric of entangled or matted nanotubes (more below). Unlike the prior art which relies on directed growth or chemical self-assembly of individual nanotubes, preferred embodiments of the present invention utilize fabrication techniques involving thin films and in most cases, lithography. This method of fabrication lends itself to generation over large surfaces especially wafers of at least six inches. (In contrast, growing individual nanotubes over a distance beyond sub millimeter distances is currently unfeasible.) The ribbons should exhibit improved fault tolerances over individual nanotubes, by providing redundancy of conduction pathways contained with the ribbons. (If an individual nanotube breaks, other tubes within the ribbon provide conductive paths, whereas if a sole nanotube were used, the cell would be faulty.) Moreover, the resistances of the ribbons should be significantly lower than that for individual nanotubes, thus, decreasing its impedance, since the ribbons may be made to have larger cross-sectional areas than individual nanotubes. The light emitting parameters of the ribbon resemble those of individual nanotubes. Thus, the predicted light emission of the ribbon should approximate additive values for the individual nanotubes.

As stated above, second substrate material 112 may be of the same material as the supports 104, however fabrication techniques described herein and in incorporated references often call for supports 104 to be a different material from the second substrate material 112, such that the material of supports 104 is differently etchable over the second substrate material 112. The inventors envision isotropic etching of substrate material, sufficiently controlled such that different materials are not necessary to make gaps of uniform and predictable dimensions.

Under one preferred embodiment, the nanotube article is made with single-walled carbon nanotubes. For resistive emission, metallic and semiconducting species can be used. For electron-hole recombination, semiconducting nanotube species can be used. Typical nanotube fabric articles have a width of 50 nm up to several microns. For embodiments that suspend a nanotube article, a typical suspension length is 50 nm up to 1 micron.

Under one embodiment, the applied voltage is about 5V and 100 uA to 500 ua of current flows through the nanotube article (i.e., light emitter). However, the actual minimum current is dependent on the design of the fabric.

Due to the characteristics of the fabric embodiments should be able to emit both black body radiation and radiation from electron-hole recombination, even though certain embodiments are primarily a resistive emitter. With appropriate design and tailoring of the fabric the emitter can achieve electron-hole recombination emission.

As explained above, the position of the channel affects light emitted from on the nanotube article. Thus, there is more control—from an engineering standpoint—as to where light is emitted from, i.e., not necessarily from the middle of a nanotube and instead where the channel or other thermal engineering exists.

As explained above, the intensity of the light is a function of the current used to stimulate the emitter. Thus the intensity may be altered by the driving circuitry, e.g., 130, or by physical design choice, e.g., changing the size of the nanotube element to alter its impedance.

The type of drive circuitry will be application dependent. The circuitry will need to ensure that sufficient current is provided to induce light emission of an intensity and duration needed by the context.

The following patent references refer to various techniques for creating nanotube fabric articles and switches and are assigned to the assignee of this application. Each is hereby incorporated by reference in their entirety:

U.S. patent application Ser. No. 10/341,005, filed on Jan. 13, 2003, entitled Methods of Making Carbon Nanotube Films, Layers, Fabrics, Ribbons, Elements and Articles;

U.S. patent application Ser. No. 09/915,093, now U.S. Pat. No. 6,919,592, filed on Jul. 25, 2001, entitled Electromechanical Memory Array Using Nanotube Ribbons and Method for Making Same;

U.S. patent application Ser. No. 10/033,032, now U.S. Pat. No. 6,784,028, filed on Dec. 28, 2001, entitled Methods of Making Electromechanical Three-Trace Junction Devices;

U.S. patent application Ser. No. 10/033,323, now U.S. Pat. No. 6,911,682, filed on Dec. 28, 2001, entitled Electromechanical Three-Trace Junction Devices;

U.S. patent application Ser. No. 10/128,117, now U.S. Pat. No. 6,835,591, filed on Apr. 23, 2002, entitled Methods of NT Films and Articles;

U.S. patent application Ser. No. 10/341,055, filed Jan. 13, 2003, entitled Methods of Using Thin Metal Layers to Make Carbon Nanotube Films, Layers, Fabrics, Ribbons, Elements and Articles;

U.S. patent application Ser. No. 10/341,054, filed Jan. 13, 2003, entitled Methods of Using Pre-formed Nanotubes to Make Carbon Nanotube Films, Layers, Fabrics, Ribbons, Elements and Articles;

U.S. patent application Ser. No. 10/341,130, filed Jan. 13, 2003, entitled Carbon Nanotube Films, Layers, Fabrics, Ribbons, Elements and Articles;

U.S. patent application Ser. No. 10/776,059, filed Feb. 11, 2004, entitled Devices Having Horizontally-Disposed Nanofabric Articles and Methods of Making The Same; and U.S. patent application Ser. No. 10/776,572, now U.S. Pat. No. 6,924,538, filed Feb. 11, 2004, entitled Devices Having Vertically-Disposed Nanofabric Articles and Methods of Making the Same.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. A light emitter, comprising:
   a nanotube article in electrical communication with a first contact and a second contact, the nanotube article comprising a matted nanotube fabric having a first thermal conductivity;
   a porous substrate having a predefined region with a second thermal conductivity, said predefined region in predefined physical relation to said nanotube article, the second thermal conductivity substantially lower than the first thermal conductivity; and
   a driving circuit in electrical communication with the first and second contacts to apply electrical stimulus to the nanotube article to induce light emission in the proximity of the predefined region.

2. The light emitter of claim 1 wherein said predefined region is a channel formed in the substrate.

3. The light emitter of claim 1 wherein said driving circuit provides electrical stimulation sufficient to induce black body radiation from the nanotube article in the proximity of the predefined region.

4. A system, comprising:
a porous substrate having a predefined region with a second thermal conductivity;
an integrated circuit in the substrate;
a light emitter having
a nanotube article in electrical communication with a first contact and a second contact, the nanotube article comprising a matted nanotube fabric having a first thermal conductivity, said nanotube article being in predefined physical relation to said predefined region, said first thermal conductivity being substantially higher than said second thermal conductivity; and
a driving circuit in electrical communication with the first and second contacts to apply electrical stimulus to the nanotube article to induce light emission in the proximity of the predefined region.

5. The system of claim 4 wherein said integrated circuit is a CMOS circuit.

6. An opto-isolator, comprising:
a light emitter having
a nanotube article in electrical communication with a first and a second contact, the nanotube article comprising a matted nanotube fabric having a first thermal conductivity;
a substrate having a predefined region with a second thermal conductivity said region in predefined physical relation to said nanotube article, said first thermal conductivity substantially higher than said second thermal conductivity; and
a driving circuit in electrical communication with the first and second contacts constructed and arranged, in relationship with at least one of the composition of the nanotube article, the porosity of the nanotube article, the porosity of the substrate, the thermal conductivity of the substrate, and the predefined physical relation to apply sufficient electrical stimulus to the nanotube article in an arbitrary direction to induce light emission in the proximity of the predefined region; and
an optical detector positioned relative to the light emitter to receive optical energy therefrom.

7. The opto-isolator of claim 6 wherein said light emitter and said optical detector are integrated in the same chip.

8. An optical integrated circuit, comprising:
a light emitter having
a nanotube article in electrical communication with a first contact and a second contact, the nanotube article comprising a matted nanotube fabric having a first thermal conductivity;
a porous substrate having a predefined region with a second thermal conductivity, said region in predefined physical relation to said nanotube article, the first thermal conductivity substantially higher than the second thermal conductivity; and
an optical detector positioned relative to the light emitter to receive optical energy therefrom.

9. The integrated circuit of claim 8 further comprising a driver circuit in electrical communication with the first and second contacts, wherein the driver circuit is an off-chip driver.

10. The integrated circuit of claim 8 further comprising a driver circuit in electrical communication with the first and second contacts, wherein the driver circuit is an on-chip driver.

11. The light emitter of claim 1, wherein the electrical stimulus is determined in accordance with one or more of the composition of the nanotube article, the porosity of the nanotube article, the porosity of the porous substrate, the second thermal conductivity, and the predefined physical relation.

12. The system of claim 4, wherein the electrical stimulus is determined in accordance with one or more of the composition of the nanotube article, the porosity of the nanotube article, the porosity of the porous substrate, the second thermal conductivity, and the predefined physical relation.

* * * * *